United States Patent
Chen et al.

(10) Patent No.: US 10,977,418 B2
(45) Date of Patent: Apr. 13, 2021

(54) SEMICONDUCTOR DEVICE WITH CELL REGION, METHOD OF GENERATING LAYOUT DIAGRAM AND SYSTEM FOR SAME

(71) Applicant: TAIWAN SEMICONDUCTOR MANUFACTURING COMPANY, LTD., Hsinchu (TW)

(72) Inventors: Sheng-Hsiung Chen, Zhubei (TW); Fong-Yuan Chang, Hsinchu (TW); Ho Che Yu, Zhubei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/579,775

(22) Filed: Sep. 23, 2019

(65) Prior Publication Data
US 2020/0104462 A1    Apr. 2, 2020

Related U.S. Application Data

(60) Provisional application No. 62/738,934, filed on Sep. 28, 2018.

(51) Int. Cl.
*H01L 21/82*       (2006.01)
*H01L 27/118*      (2006.01)
(Continued)

(52) U.S. Cl.
CPC .......... *G06F 30/398* (2020.01); *G06F 30/392* (2020.01); *H01L 27/11575* (2013.01)

(58) Field of Classification Search
CPC ................................................ H01L 27/11575
(Continued)

(56) References Cited

U.S. PATENT DOCUMENTS 7,260,442 B2    8/2007  Hwang et al.
8,850,366 B2 *  9/2014  Liu .......................... G06F 30/39
                                                         716/53
(Continued)

FOREIGN PATENT DOCUMENTS

KR        20170023358       3/2017
KR          101821460       1/2018

OTHER PUBLICATIONS

Notice of Allowance dated Sep. 11, 2020 from corresponding application No. TW 108134926, pp. 1-5.
(Continued)

*Primary Examiner* — Calvin Lee
(74) *Attorney, Agent, or Firm* — Hauptman Ham, LLP

(57) ABSTRACT

A semiconductor device including: first, second and third active regions a first gate structure over the first active region and a first part of the second active region; a second gate structure over the third active region and a second part of the second active region; a first cell region including the first gate structure, the first active region and the first part of the second active region; a second cell region including the second gate structure, the third active region and the second part of the second active region; a first border region representing an overlap of the first and second cell regions which is substantially aligned with an approximate midline of the second active region; the second gate structure overlapping the first border region; and there being a first gap which is between the first gate structure and the first border region.

20 Claims, 16 Drawing Sheets

(51) Int. Cl.
*G06F 30/398* (2020.01)
*G06F 30/392* (2020.01)
*H01L 27/11575* (2017.01)

(58) Field of Classification Search
USPC .................................. 257/203, 499; 438/129
See application file for complete search history.

(56) References Cited

U.S. PATENT DOCUMENTS

| | | |
|---|---|---|
| 9,256,709 B2 | 2/2016 | Yu et al. |
| 9,461,065 B1 | 10/2016 | Haigh |
| 10,770,472 B2 * | 9/2020 | Kim .................. H01L 27/11573 |
| 2013/0026572 A1 | 1/2013 | Kawa et al. |
| 2014/0040838 A1 | 2/2014 | Liu et al. |
| 2015/0179646 A1 | 6/2015 | Azmat et al. |
| 2015/0278429 A1 | 10/2015 | Chang |
| 2016/0147927 A1 | 5/2016 | Chiang et al. |
| 2017/0053917 A1 | 2/2017 | Azmat et al. |
| 2017/0373090 A1 | 12/2017 | Correale, Jr. et al. |

OTHER PUBLICATIONS

Office Action dated Sep. 29, 2020 for corresponding case No. KR 10-2019-0120147. (pp. 1-5).

* cited by examiner

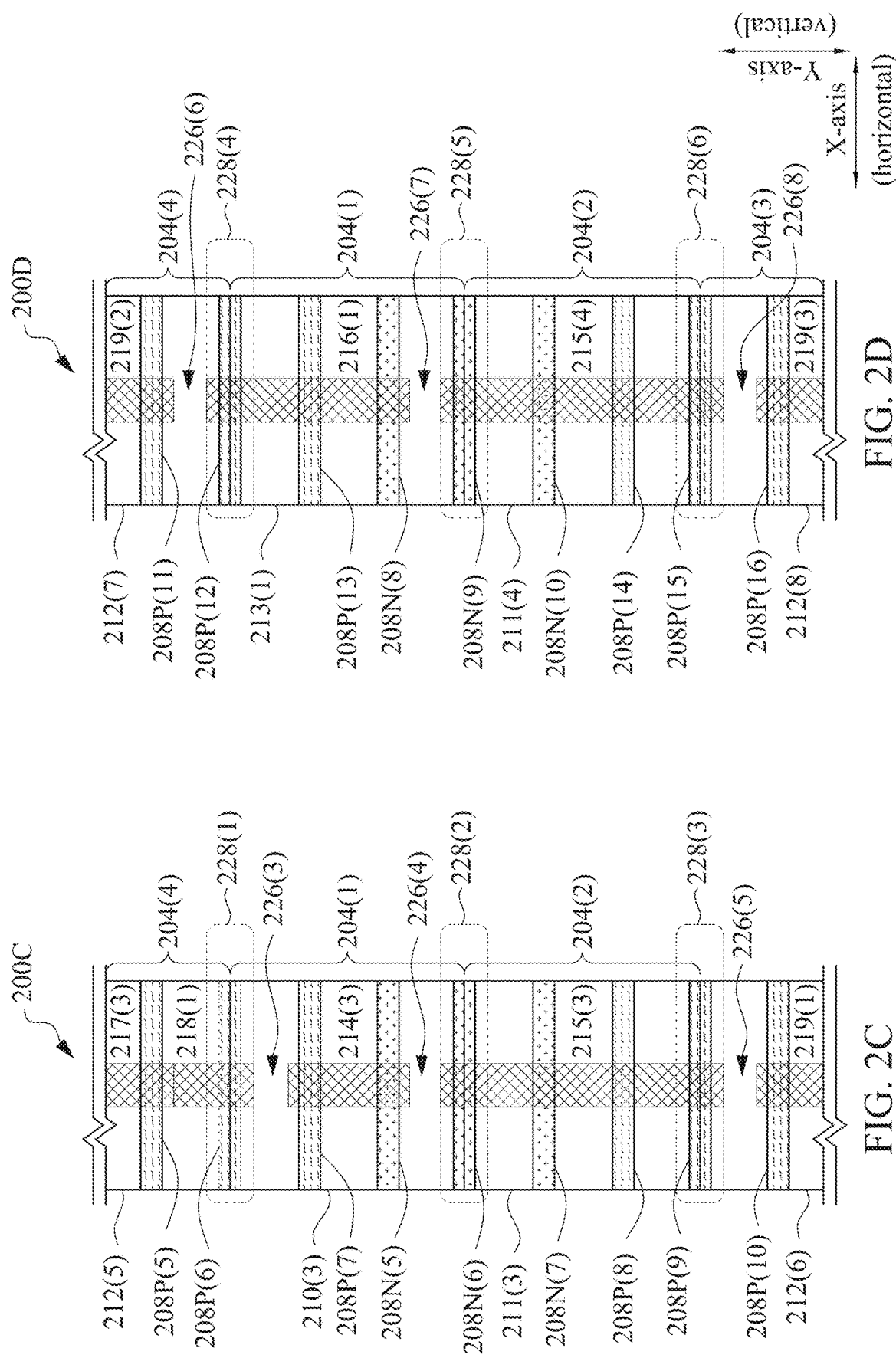

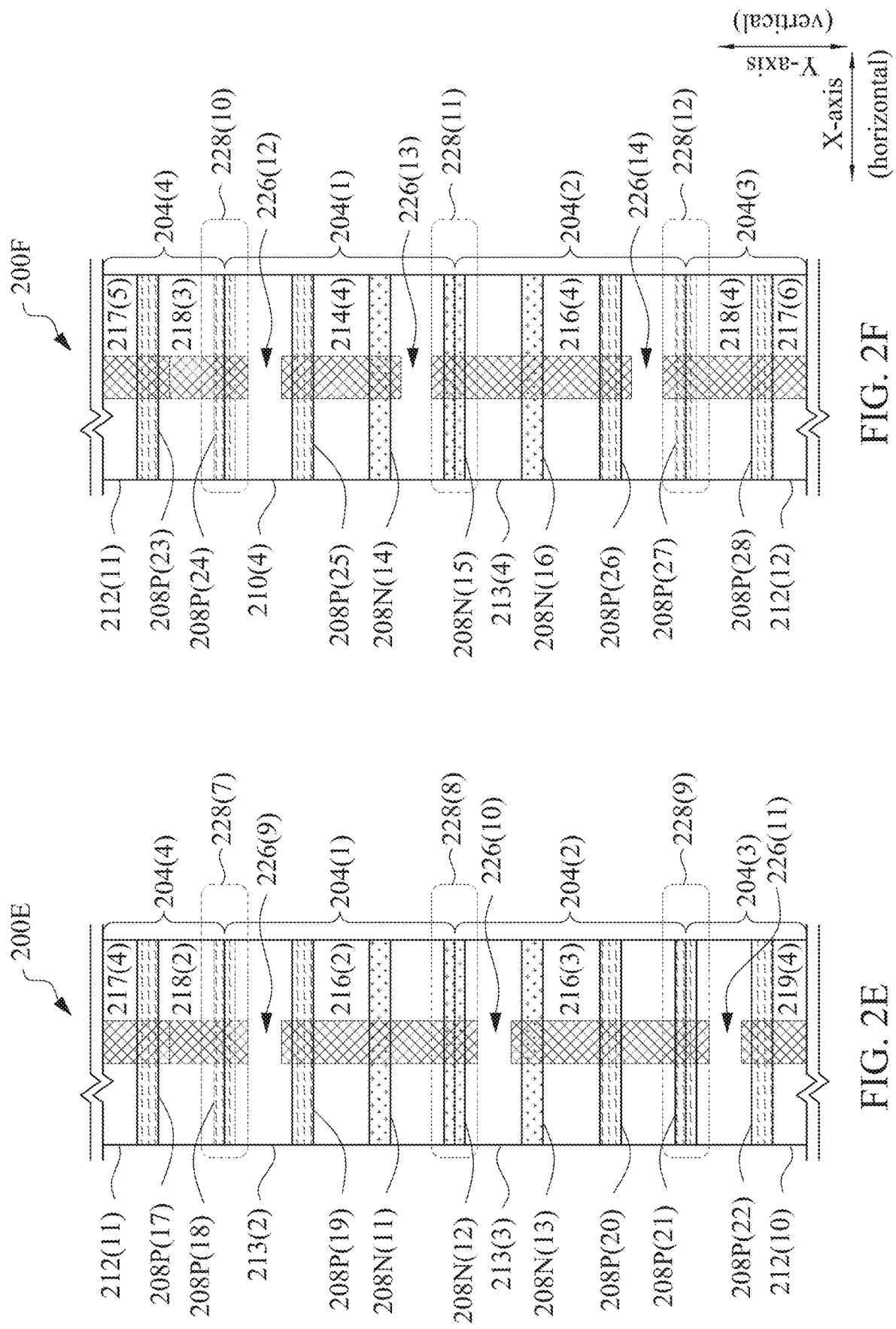

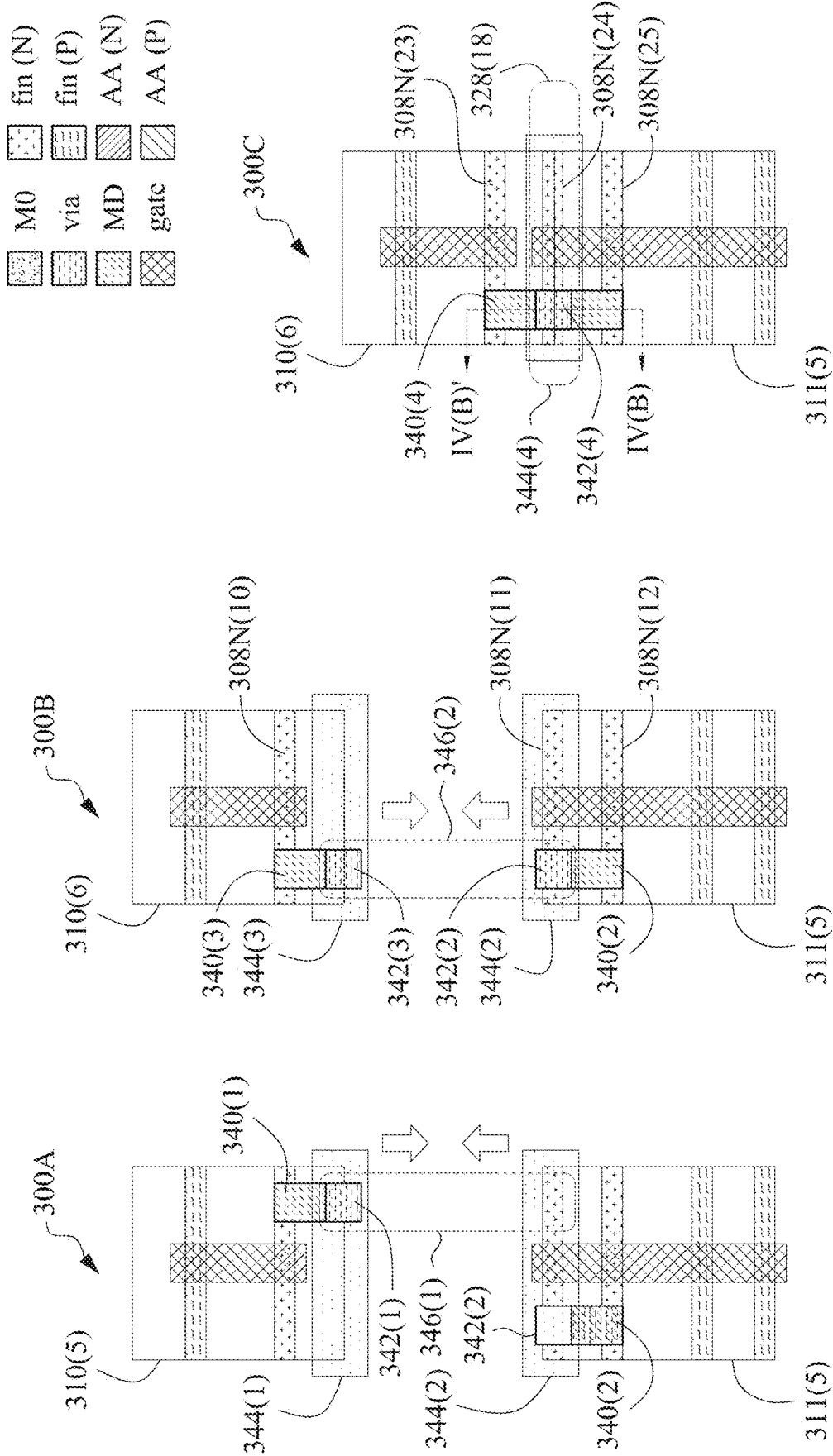

US 10,977,418 B2

SEMICONDUCTOR DEVICE WITH CELL REGION, METHOD OF GENERATING LAYOUT DIAGRAM AND SYSTEM FOR SAME

PRIORITY CLAIM

This application claims priority to U.S. Provisional Patent Application Ser. No. 62/738,934 filed Sep. 28, 2018, which is incorporated herein by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process technology node by which will be fabricated a semiconductor device based on a layout diagram. The design rule set compensates for variability of the corresponding process technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2H are corresponding layout diagrams 200A-200H, in accordance with some embodiments.

FIGS. 3A-3C are corresponding layout diagrams 300A-300C, in accordance with some embodiments.

DETAILED DESCRIPTION

Figure 1:
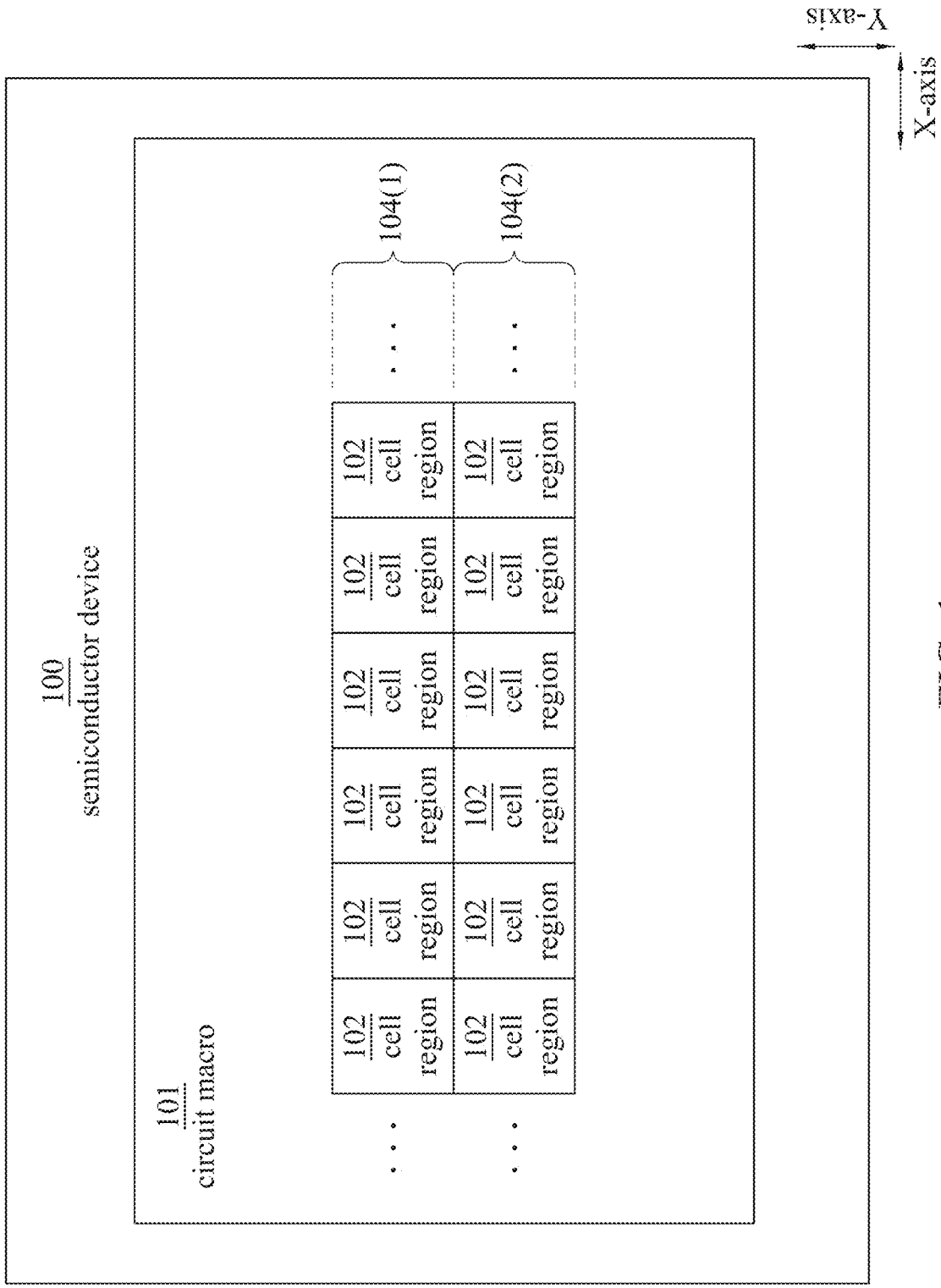
FIG. 1 is a block diagram, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate relationships between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device has a cell region which includes at least one border-encroaching active region. In some embodiments, there is provided a method and system for generating the same. In some embodiments, such a method assumes that rows and fin patterns of a layout diagram extend substantially parallel to the X-axis (in the horizontal direction), and that gate patterns of the layout diagram extend substantially parallel to the Y-axis (in the vertical direction). In some embodiments, such a method further assumes a library of standard cells which includes first and second single row-height (SRH) standard cells, the first SRH standard cell having one fin-pair (hereinafter, a 'one-fin cell'), and the second SRH standard cell having two pairs (hereinafter, a 'two-fin cell'), where each fin-pair includes one fin pattern designated for PMOS configuration and one fin pattern designated for NMOS configuration. In some embodiments, relative to the vertical direction, such a method further assumes that a first cell is abutted with (or stacked on) a second cell, and that that a first gate pattern of the first cell does not overlap a second gate pattern of the second cell so that corresponding first and second gate electrodes (of corresponding first and second cell regions in a semiconductor device based on the layout diagram) are not electrically coupled.

According to another approach, relative to the vertical direction, in order to enhance electrical isolation, neither of the first gate pattern nor the second gate pattern is permitted to overlap a fin pattern which straddles the border of the first and second cells, resulting in each of the one-fin and two-fin cells has a height equal to 5 TP, where TP represents a track pitch. As a result of the design rule according to the other approach, a cut pattern is generated over the straddling fin pattern (to indicate subsequent removal of the straddling fin pattern) or the straddling fin pattern is designated for configuration as a dummy fin, which wastes the space occupied by the straddling fin at the top and bottom of each of the one-fin and two-fin cells, and further wastes the space in the one-fin cell that otherwise would have been occupied by the second fin-pair. By contrast, according to at least some embodiments, one of the first and second gate patterns is permitted to overlap (or encroach upon), and electrically couple with, the straddling fin pattern so that a corresponding one of corresponding first and second gate electrodes (of corresponding first and second cell regions in a semiconductor device based on the layout diagram) is electrically coupled to the corresponding straddling fin which results in an improved cell density, and corresponding layout diagram density, as compared to the other approach. According to at least some embodiments, each of the one-fin and two-fin cells has a height of 3 TP, which represents a ⅖ reduction in height as compared to the other approach.

FIG. 1 is a block diagram of a semiconductor device 100 in accordance with some embodiments.

In FIG. 1, semiconductor device 100 includes, among other things, a circuit macro (hereinafter, macro) 101. In some embodiments, macro 101 is a logic macro. In some embodiments, macro 101 is an SRAM macro. In some embodiments, macro 101 is a macro other than a logic macro or an SRAM macro. Macro 101 includes, among other things, one or more cell regions 102 arranged in corresponding rows 104(1)-104(2). In some embodiments, each cell region 102 is implemented based on a layout diagram resulting from one or more of the methods disclosed herein and so has an improved cell-region density.

Figure 2A:
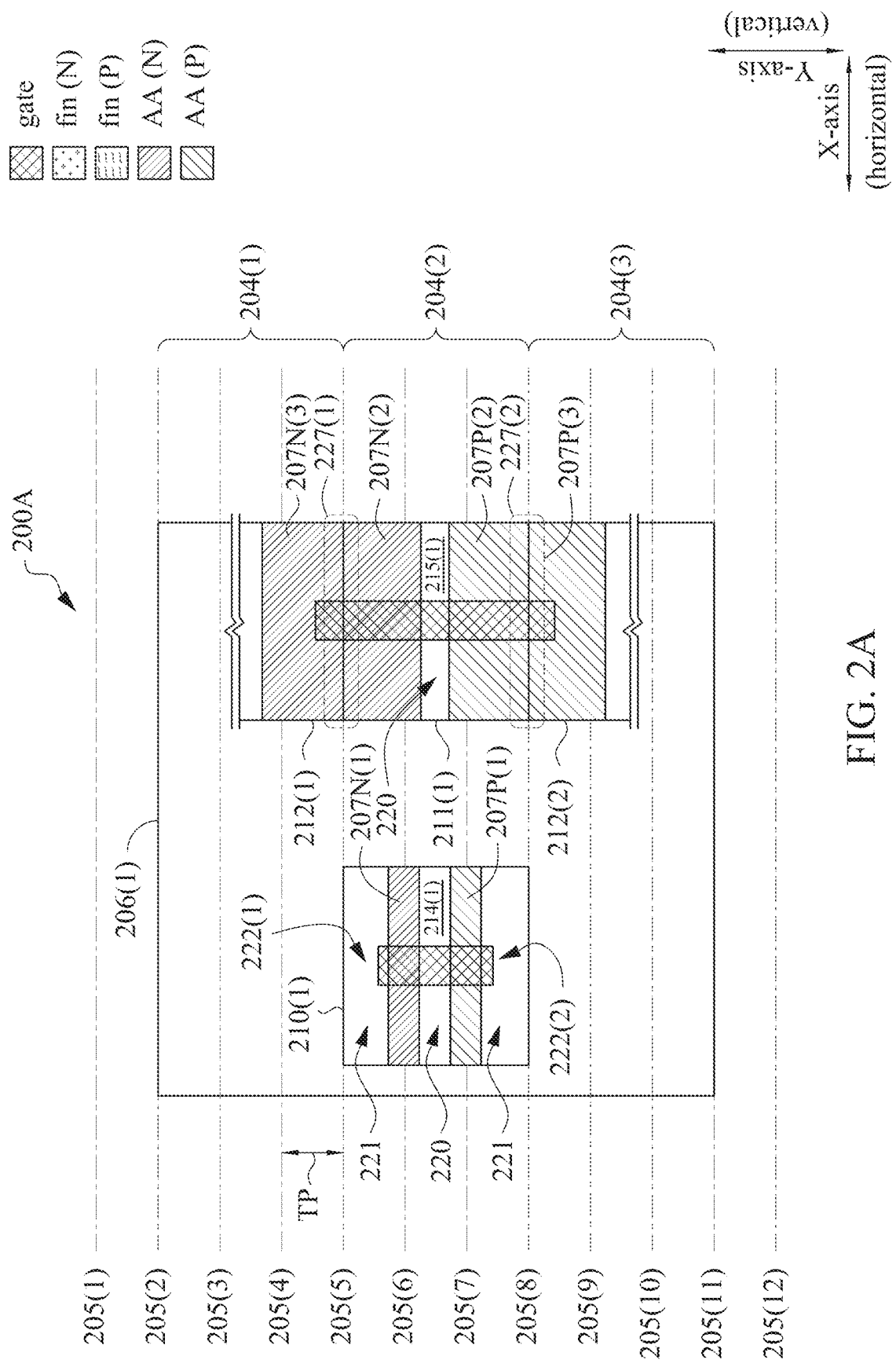
Figure 2B:
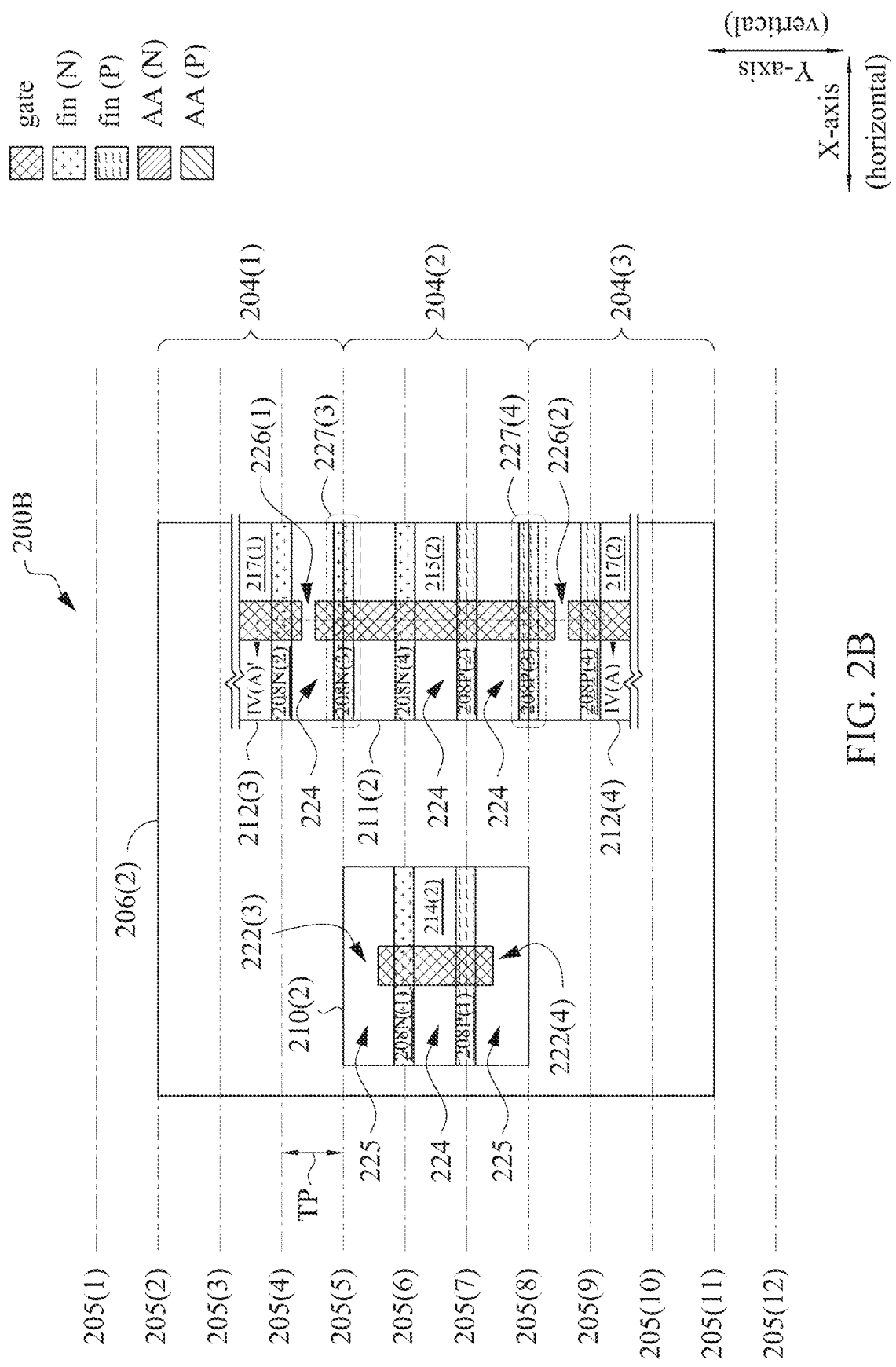

FIGS. 2A-2B are corresponding layout diagrams 200A-200B, in accordance with some embodiments.

FIGS. 2A-2B assume an orthogonal XYZ coordinate system in which the X-axis, Y-axis and Z-axis represent corresponding first, second and third directions. In some embodiments, where a page of print medium represents a plane, e.g., a piece of paper, FIGS. 2A-2B assume that the X-axis and Y-axis are coplanar with a page, and the Z-axis is orthogonal to the plane of the page. In some embodiments, the first, second and third directions correspond to a different orthogonal coordinate system than the XYZ coordinate system.

Layout diagrams 200A-200B are arranged with respect to track lines, including track lines 205(1), 205(2), 205(3), . . . , 205(10), 205(11) and 205(12), which are oriented substantially parallel to the X-axis. Tracks 205(1)-205(12) have a pitch, TP, determined by the design rules and scale of the corresponding semiconductor process technology node. Layout diagrams 200A-200B also are arranged with respect to rows, including rows 204(1), 204(2) and 204(3), which are oriented substantially parallel to the X-axis. Relative to the Y-axis, each row has a height of 3 TP. In some embodiments, the rows have a height different than 3 TP. Accordingly, for a library of standard cells associated with the corresponding semiconductor process technology node, a single row-height (SRH) standard cell has a height of 3 TP, which represents a ⅖ reduction in height as compared to the other approach.

In FIG. 2A, layout diagram 200A includes a substrate pattern 206(1), and cells 210(1) and 211(1) correspondingly on substrate pattern 206(1). Each of 210(1) and 211(1) is a SRH standard cell. Each of cells 210(1) and 211(1) is in row 204(2). Layout diagram 200A further includes cells 212(1) and 212(2), each of which is partially shown for simplicity of illustration. Relative to the Y-axis: cell 212(1) is in row 204(1) so that the bottom side thereof abuts (or is stacked on) the top side of cell 211(1); and cell 212(2) is in row 204(3) so that the top side thereof abuts (or is stacked underneath) the bottom side of cell 211(1).

In some embodiments cell 210(1) represents a first subset of one or more of cell regions 102 in semiconductor device 100 of FIG. 1, and cell 211(1) represents a second subset of one or more cell regions 102 in semiconductor device 100 of FIG. 1. Though not shown for simplicity of illustration, in some embodiments, layout diagram 200A includes additional instances of cell 210(1), and/or additional instances of cell 211(1), and/or additional instances of cells 212(1) and/or 212(2).

Layout diagram 200A further includes active area patterns having corresponding long axes which extend substantially parallel to the X-axis. For example, cell 210(1) includes active area patterns 207N(1) and 207P(1) which are substantially aligned with corresponding tracks 205(6) and 205(7).

Active area patterns 207N(1) and 207P(1) represent corresponding NMOS and PMOS planar active regions in a semiconductor device based on layout diagram 200A. Accordingly, active area patterns 207N(1) and 207P(1) are designated for corresponding NMOS and PMOS planar transistor configurations. In some embodiments, active area patterns 207N(1) and 207P(1) are designated for corresponding planar transistor configurations other than corresponding NMOS and PMOS planar transistor configurations. In some embodiments, each of active area patterns 207N(1) and 207P(1) is represented correspondingly by one or more fin patterns (see FIG. 2B). In some embodiments, active area patterns 207N(1) and 207P(1) are designated for nano-wire configuration. In some embodiments, active area patterns 207N(1) and 207P(1) are designated for nano-sheet configuration. In some embodiments, active area patterns 207N(1) and 207P(1) are designated for Gate-All-Around (GAA) configuration. In some embodiments in which an active region is referred to as an oxide-dimensioned (OD) region, active area patterns 207N(1) and 207P(1) are referred to as corresponding OD patterns 207N(1) and 207P(1). Cell 211(1) includes active area patterns 207N(2) and 207P(2).

Cell 212(1) includes active area pattern 207N(3). Relative to the vertical direction, active area pattern 207N(3) is abutted with active area pattern 207N(2) such that active area patterns 207N(2) and 207N(3) represent corresponding first and second parts of a larger active area pattern which is shared correspondingly by cell 211(1) and cell 212(1). Where active area patterns 207N(2) and 207N(3) abut, a border region 227(1) is formed, a long axis of which is substantially aligned with the top border of cell 211(1) and the bottom border of cell 212(1). Border region 227(1) straddles a top area of cell 211(1) and a bottom area of cell 212(1). As a practical matter, the long axis of border region 227(1) also is substantially aligned with an approximate midline of the larger active area pattern which includes active area patterns 207N(2) and 207N(3).

Cell 212(2) includes active area pattern 207P(2). Relative to the vertical direction, active area pattern 207P(3) is abutted with active area pattern 207P(2) such that active area patterns 207P(2) and 207P(3) represent corresponding first and second parts of a larger active area pattern which is shared correspondingly by cell 211(1) and cell 212(2). Where active area patterns 207P(2) and 207P(3) abut, a border region 227(2) is formed, a long axis of which is substantially aligned with the bottom border of cell 211(1) and the top border of cell 212(2). Border region 227(2) straddles a bottom area of cell 211(1) and a top area of cell 212(2). As a practical matter, the long axis of border region 227(2) also is substantially aligned with an approximate midline of the larger active area pattern which includes active area patterns 207P(2) and 207P(3).

In FIG. 2A, cell 210(1) includes a gate pattern 214(1) and cell 211(1) includes a gate pattern 215(1). Long axes of corresponding gate patterns 214(1) and 215(1) extend substantially parallel to the Y-axis. Relative to the Y-axis, gate pattern 214(1) overlaps active area patterns 207N(1) and 207P(1). Relative to the Y-axis, there is: a gap 222(1) between a top end of gate pattern 214(1) and the top border of cell 210(1); and a gap 222(2) between a bottom end of gate pattern 214(1) and the bottom border of cell 210(1). Relative to the Y-axis, gate pattern 215(1) overlaps active area patterns 207N(2) and 207P(2), and further extends so as to overlap border regions 227(1) and 227(2). As such, gate pattern 215(1) encroaches upon (or into) active area pattern 207N(3) of cell 212(1). For simplicity of illustration, each of cells 210(1) and 211(1) is shown as including one gate pattern. In some embodiments, cell 210(1) and/or 211(1) includes multiple gate patterns separated from each other along the X-axis. Relative to the X-axis gate patterns are separated by a distance a uniform distance. In some embodiments, the uniform distance represents one contacted poly pitch (CPP) for the corresponding semiconductor process technology node.

Cells 210(1) and 211(1) represent corresponding circuits. In some embodiments, cells 210(1) and 211(1) represent corresponding circuits which provide corresponding functions. In some embodiments, cells 210(1) and 211(1) represent corresponding circuits which provide corresponding logical functions, and are referred to accordingly as logic cells. In some embodiments, at least one of cells 210(1) and 211(1) represent corresponding circuits which provide corresponding functions other than a logical function.

Turning to FIG. 2B, layout diagram 200B is similar to layout diagram 200A. FIG. 2B follows a similar numbering convention to that of FIG. 2A. Though corresponding, some components also differ. To help identify components which correspond but nevertheless have differences, the numbering convention uses parenthetical numbers. For example, pattern 206(2) in FIG. 2B and pattern 206(1) in FIG. 2A are both substrate patterns, with similarities being reflected in the common root 206(_) and with the differences being reflected in the parentheticals _(1) and _(2). For brevity, the discussion will focus more on differences between FIG. 2B and FIG. 2A than on similarities.

In FIG. 2B, fin patterns have been used to represent corresponding active area patterns of FIG. 2A. More particularly, fin patterns 208N(1) and 208P(1) in cell 210(2) of FIG. 2B have been used to represent corresponding active area patterns 207N(1) and 207P(1) in corresponding cell 210(1) of FIG. 2A. Fin patterns 208N(4) and 208N(3) in cell 211(2) of FIG. 2B have been used to represent active area pattern 207N(2) in corresponding cell 211(1) of FIG. 2A. Fin patterns 208P(2) and 208P(3) in cell 211(2) of FIG. 2B have been used to represent active area pattern 207P(2) in corresponding cell 211(1) of FIG. 2A. Fin patterns 208N(2) and 208N(3) in cell 212(3) of FIG. 2B have been used to represent active area pattern 207N(3) in corresponding cell 212(1) of FIG. 2A. Fin patterns 208P(3) and 208P(4) in cell 212(4) of FIG. 2B have been used to represent active area pattern 207P(3) in corresponding cell 212(2) of FIG. 2A.

Cell 210(2) is SRH standard cell and also is described as one-fin cell which has one fin-pair. Cell 211(2) is SRH standard cell and also is described as two-fin cell which has two fin-pairs. In some embodiments, each fin-pair includes one fin pattern designated for NMOS configuration and one fin pattern designated for PMOS configuration.

In FIG. 2B, fin patterns 208N(1)-208N(4) and 208P(1)-208P(4) represent corresponding NMOS and NMOS fins in a semiconductor device based on layout diagram 200B. Accordingly, active area patterns fin patterns 208N(1)-208N(4) and 208P(1)-208P(4) are designated for corresponding NMOS finFET and PMOS finFET configuration. In some embodiments, active area patterns fin patterns 208N(1)-208N(4) and 208P(1)-208P(4) are designated for corresponding PMOS finFET and NMOS finFET configuration. In some embodiments, fin patterns 208N(1)-208N(4) and 208P(1)-208P(4) are designated for nano-wire configuration. In some embodiments, a fin patterns 208N(1)-208N(4) and 208P(1)-208P(4) are designated for nano-sheet configuration. In some embodiments, fin patterns 208N(1)-208N(4) and 208P(1)-208P(4) are designated for Gate-All-Around (GAA) configuration. In some embodiments, quantities of fin patterns other than the quantities shown in FIG. 2B are included in corresponding cells 210(2), 211(2), 212(3) and 212(4).

In layout diagram 200B, cell 212(3) further includes a gate pattern 217(1) which extends toward a bottom border of cell 212(3) sufficiently far to overlap fin pattern 208N(2). Cell 212(4) further includes a gate pattern 217(2) which extends toward a top border of cell 212(4) sufficiently far to overlap fin pattern 208P(4). Relative to the Y-axis, there is: a gap 226(1) between a top end of gate pattern 215(2) and a bottom end of gate pattern 217(1); and a gap 226(2) between a bottom end of gate pattern 215(2) and a top end of gate pattern 217(2).

Border region 227(3), which straddles a top area of cell 211(2) and a bottom area of cell 212(3), also straddles fin pattern 208N(3). Border region 227(4), which straddles a bottom area of cell 211(2) and a top area of cell 212(4), also straddles fin pattern 208P(3). By contrast, according to the other approach, no gate pattern would be permitted to overlap fin pattern 208N(3) which straddles the top area of cell 211(2) and the bottom area of cell 212(3), and no gate pattern would be permitted to overlap fin pattern 208P(3) which straddles the bottom area of cell 211(2) and the top area of cell 212(4). In effect, fin pattern 208N(3) is shared by cells 211(2) and 212(3), and fin pattern 208P(3) is shared by cells 211(2) and 212(4). By overlapping fin pattern 208N(3), gate pattern 215(2) of cell 211(2) encroaches upon cell 212(3). By overlapping fin pattern 208P(3), gate pattern 215(2) of cell 211(2) encroaches upon cell 212(4). By encroaching upon each of cells 212(3) and 212(4), cell 211(2) provides a two-fin cell having a single row-height (SRH), which avoids wasted space otherwise incurred according to the other approach. Each of cells 210(2) and 211(2) has a height of 3 TP, which represents a ⅖ reduction in height as compared to the other approach.

FIGS. 2C-2H are corresponding layout diagrams 200C-200H, in accordance with some embodiments.

Layout diagrams 200C-200H are similar to layout diagram 200B of FIG. 2B. FIGS. 2C-2H follows a similar numbering convention to that of FIG. 2B. Though corresponding, some components also differ. To help identify components which correspond but nevertheless have differences, the numbering convention uses parenthetical numbers. For example, cell 211(3) in FIG. 2C and cell 211(2) in FIG. 2B are both two-fin cells, with similarities being reflected in the common root 211(_) and with the differences being reflected in the parentheticals _(3) and _(2). For brevity, the discussion will focus more on differences between FIGS. 2C-2H and FIG. 2B than on similarities, and differences amongst FIGS. 2C-2H than on similarities. Some similar elements in FIGS. 2C-2H have been eliminated for simplicity of illustration, e.g., counterparts of substrate pattern 206(2) and track lines 205(1)-205(12) have not been shown in FIGS. 2C-2H.

In FIG. 2C, layout diagram 200C includes fin patterns 208P(5)-208P(10) and 208N(5)-208N(7), and gate patterns 218(1), 214(3), 215(3) and 219(1) in corresponding cells 212(5), 210(3), 211(3) and 212(6). Partial cell 212(5), one-fin cell 210(3), two-fin cell 211(3) and partial cell 212(6) are in corresponding rows 204(4), 204(1), 204(2) and 204(3). Relative to the Y-axis, cell 212(5) is located so that the bottom side thereof abuts (or is stacked on) the top side of cell 210(3) at a border region 228(1); cell 210(3) is located so that the bottom side thereof abuts the top side of cell 211(3) at a border region 228(2); and cell 211(3) is located so that the bottom side thereof abuts the top side of cell 212(6) at a border region 228(3).

Relative to the Y-axis, there is: a gap 226(3) between a bottom end of gate pattern 218(1) and a top end of gate pattern 214(3); a gap 226(4) between a bottom end of gate pattern 214(3) and a top end of gate pattern 215(3); and a gap 226(5) between a bottom end of gate pattern 214(3) and a top end of gate pattern 219(1).

The bottom end of gate pattern 217(3) extends toward the bottom border of cell 212(5) sufficiently far to overlap fin pattern 208P(6). The top end of gate pattern 215(3) extends toward the top border of cell 211(3) sufficiently far to overlap fin pattern 208N(6). The bottom end of gate pattern 215(3) extends toward the bottom border of cell 211(3) sufficiently far to overlap fin pattern 208P(9).

Border region 228(1) straddles fin pattern 208P(6). Border region 228(2) straddles fin pattern 208N(6). Border region 228(3) straddles fin pattern 208P(9). By contrast, according to the other approach, no gate pattern would be permitted to overlap fin pattern 208P(6), nor fin pattern 208N(6), nor fin pattern 208P(9). By encroaching upon each of cells 210(3) and 212(6), cell 211(3) provides a two-fin cell having a single row-height (SRH), which avoids wasted space otherwise incurred according to the other approach. Each of cells 210(3) and 211(3) has a height of 3 TP, which represents a ⅖ reduction in height as compared to the other approach. Similarly, by encroaching upon cell 210(3), cell 212(5) avoids wasted space otherwise incurred according to the other approach.

In some embodiments, fin pattern 208P(6) is not included such that fin pattern 208P(6) is optional as indicated by the dashed outline of fin pattern 208P(6). In some embodiments, where fin pattern 208P(6) is not included, portion 218(1) of gate pattern 217(3) correspondingly is not included such that portion 218(1) is optional as indicated by the dashed outline of portion 218(1).

Turning to FIG. 2D, layout diagram 200D includes fin patterns 208P(11)-208P(16) and 208N(8)-208N(10), and gate patterns 219(2), 216(1), 215(4) and 219(3) in corresponding cells 212(7), 213(1), 211(4) and 212(8). Partial cell 212(7), cell 213(1), two-fin cell 211(4) and partial cell 212(8) are in corresponding rows 204(4), 204(1), 204(2) and 204(3). Relative to the Y-axis, cell 212(7) is located so that the bottom side thereof abuts (or is stacked on) the top side of cell 213(1) at a border region 228(4); cell 213(1) is located so that the bottom side thereof abuts the top side of cell 211(4) at a border region 228(5); and cell 211(4) is located so that the bottom side thereof abuts the top side of cell 212(8) at a border region 228(6).

In FIG. 2D, cell 213(1) is SRH standard cell and also is described as 1.5-fin cell, and as such has 1.5 fin-pairs. Cell 213(1) includes a full fin-pair and a half fin-pair. The full pair corresponds to fin patterns 208P(13) and 208N(8). The half fin-pair corresponds to fin pattern 208P(12).

Relative to the Y-axis, there is: a gap 226(6) between a bottom end of gate pattern 219(2) and a top end of gate pattern 216(1); a gap 226(7) between a bottom end of gate pattern 216(1) and a top end of gate pattern 215(4); and a gap 226(8) between a bottom end of gate pattern 215(4) and a top end of gate pattern 219(3).

The top end of gate pattern 216(1) extends toward the top border of cell 213(1) sufficiently far to overlap fin pattern 208P(12). The top end of gate pattern 215(4) extends toward the top border of cell 211(4) sufficiently far to overlap fin pattern 208N(9). The bottom end of gate pattern 215(4) extends toward the bottom border of cell 211(4) sufficiently far to overlap fin pattern 208P(15).

Border region 228(4) straddles fin pattern 208P(12). Border region 228(5) straddles fin pattern 208N(9). Border region 228(6) straddles fin pattern 208P(15). By contrast, according to the other approach, no gate pattern would be permitted to overlap fin pattern 208P(12), nor fin pattern 208N(9), nor fin pattern 208P(15). By encroaching upon cell 212(7), cell 213(1) provides a 1.5-fin cell having a single row-height (SRH), which avoids wasted space otherwise incurred according to the other approach. By encroaching upon each of cells 213(1) and 212(8), cell 211(4) provides a two-fin cell having a single row-height (SRH), which avoids wasted space otherwise incurred according to the other approach. Each of cells 213(1) and 211(3) has a height of 3 TP, which represents a ⅖ reduction in height as compared to the other approach.

Turning to FIG. 2E, layout diagram 200E includes fin patterns 208P(17)-208P(22) and 208N(11)-208N(13), and gate patterns 217(4), 216(2), 216(3) and 219(4) in corresponding cells 212(11), 213(2), 213(3) and 212(10). Partial cell 212(10), 1.5-fin cell 213(2), 1.5-fin cell 213(3) and partial cell 212(10) are in corresponding rows 204(4), 204(1), 204(2) and 204(3). Relative to the Y-axis, cell 212(11) is located so that the bottom side thereof abuts (or is stacked on) the top side of cell 213(2) at a border region 228(7); cell 213(2) is located so that the bottom side thereof abuts the top side of cell 213(3) at a border region 228(8); and cell 213(3) is located so that the bottom side thereof abuts the top side of cell 212(10) at a border region 228(9).

Relative to the Y-axis, there is: a gap 226(9) between a bottom end of gate pattern 217(4) and a top end of gate pattern 216(2); a gap 226(10) between a bottom end of gate pattern 216(2) and a top end of gate pattern 216(3); and a gap 226(11) between a bottom end of gate pattern 216(3) and a top end of gate pattern 219(4).

The bottom end of gate pattern 217(4) extends toward the bottom border of cell 212(11) sufficiently far to overlap fin pattern 208P(18). The bottom end of gate pattern 216(2) extends toward the bottom border of cell 213(2) sufficiently far to overlap fin pattern 208N(12). The bottom end of gate pattern 216(3) extends toward the bottom border of cell 213(3) sufficiently far to overlap fin pattern 208P(21).

Border region 228(7) straddles fin pattern 208P(18). Border region 228(8) straddles fin pattern 208N(12). Border region 228(9) straddles fin pattern 208P(21). By contrast, according to the other approach, no gate pattern would be permitted to overlap fin pattern 208P(18), nor fin pattern 208N(12), nor fin pattern 208P(21). By encroaching upon cell 213(3), cell 213(2) provides a 1.5-fin cell having a single row-height (SRH), which avoids wasted space otherwise incurred according to the other approach. By encroaching upon cell 212(10), cell 213(3) provides a 1.5-fin cell having a single row-height (SRH), which avoids wasted space otherwise incurred according to the other approach. Similarly, by encroaching upon cell 213(2), cell 212(11) avoids wasted space otherwise incurred according to the other approach. Each of cells 213(2) and 213(3) has a height of 3 TP, which represents a ⅖ reduction in height as compared to the other approach.

In some embodiments, fin pattern 208P(18) is optional as indicated by the dashed outline of fin pattern 208P(18). In some embodiments, where fin pattern 208P(18) is not included, portion 218(2) of gate pattern 217(4) correspondingly is not included such that portion 218(2) is optional as indicated by the dashed outline of portion 218(2).

Turning to FIG. 2F, layout diagram 200F includes fin patterns 208P(23)-208P(28) and 208N(14)-208N(16), and gate patterns 217(5), 214(4), 216(4) and 217(6) in corresponding cells 212(11), 210(4), 213(4) and 212(12). Partial cell 212(11), one-fin cell 210(4), 1.5-fin cell 213(4) and partial cell 212(12) are in corresponding rows 204(4), 204(1), 204(2) and 204(3). Relative to the Y-axis, cell 212(11) is located so that the bottom side thereof abuts (or is stacked on) the top side of 210(4) at a border region 228(10); cell 210(4) is located so that the bottom side thereof abuts the top side of cell 213(4) at a border region 228(11); and cell 213(4) is located so that the bottom side thereof abuts the top side of cell 212(12) at a border region 228(12).

Relative to the Y-axis, there is: a gap 226(12) between a bottom end of gate pattern 217(5) and a top end of gate pattern 214(4); a gap 226(13) between a bottom end of gate pattern 214(4) and a top end of gate pattern 216(4); and a gap 226(14) between a bottom end of gate pattern 216(4) and a top end of gate pattern 217(6).

The bottom end of gate pattern 217(5) extends toward the bottom border of cell 212(11) sufficiently far to overlap fin pattern 208P(24). The top end of gate pattern 216(4) extends toward the top border of cell 213(4) sufficiently far to overlap fin pattern 208N(15). The top end of gate pattern 217(6) extends toward the top border of cell 212(12) sufficiently far to overlap fin pattern 208P(27).

Border region 228(10) straddles fin pattern 208P(24). Border region 228(11) straddles fin pattern 208N(15). Border region 228(12) straddles fin pattern 208P(27). By contrast, according to the other approach, no gate pattern would be permitted to overlap fin pattern 208P(24), nor fin pattern 208N(15), nor fin pattern 208P(27). By encroaching upon cell 210(4), cell 213(4) provides a 1.5-fin cell having a single row-height (SRH), which avoids wasted space otherwise incurred according to the other approach. Similarly, by encroaching upon cell 210(4), cell 212(11) avoids wasted space otherwise incurred according to the other approach. By encroaching upon cell 213(4), 210(12) avoids wasted space otherwise incurred according to the other approach. Cell 213(4) has a height of 3 TP, which represents a ⅖ reduction in height as compared to the other approach.

In some embodiments, fin pattern 208P(24) is optional as indicated by the dashed outline of fin pattern 208P(24). In some embodiments, where fin pattern 208P(24) is not included, portion 218(3) of gate pattern 217(5) correspondingly is not included such that portion 218(3) is optional as indicated by the dashed outline of portion 218(3). In some embodiments, fin pattern 208P(27) is optional as indicated by the dashed outline of fin pattern 208P(27). In some embodiments, where fin pattern 208P(27) is not included, portion 218(4) of gate pattern 217(6) correspondingly is not included such that portion 218(4) is optional as indicated by the dashed outline of portion 218(3).

Figure 2G:
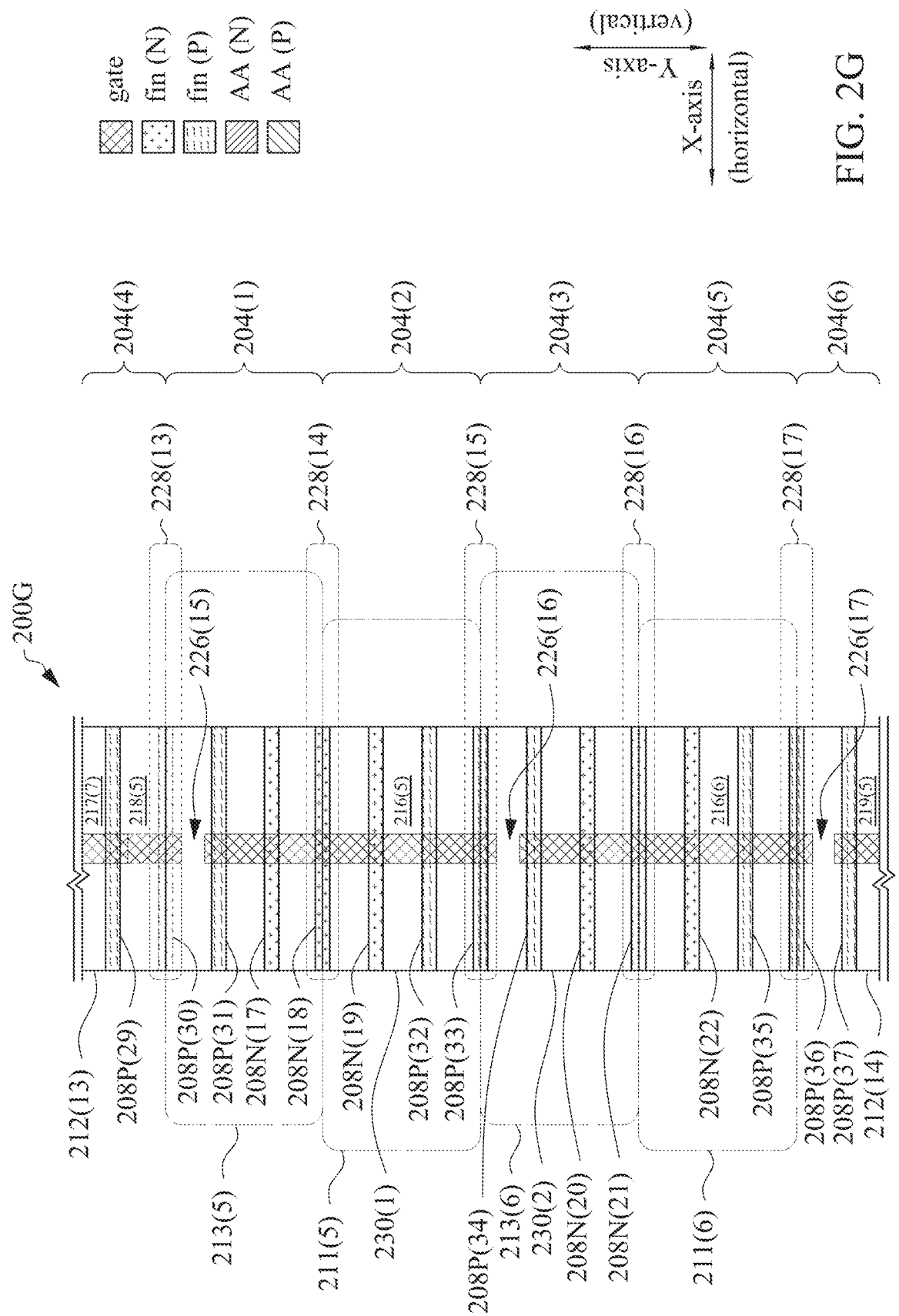

Turning to FIG. 2G, layout diagram 200G includes fin patterns 208P(29)-208P(37) and 208N(17)-208N(22), and gate patterns 217(7), 216(5), 216(6) and 219(5) in corresponding cells 212(13), 230(1), 230(2) and 212(14). Partial cell 212(13) and partial cell 212(14) are in corresponding rows 204(4) and 204(6). Cell 230(1) is a double row-height (DRH) cell and is located across rows 204(1) and 204(2). Cell 230(2) is a DRH cell and is located across rows 204(3) and 204(5).

In FIG. 2G, cell 230(1) is DRH standard cell and also is described as three-fin cell, and as such has three fin-pairs, corresponding to fin patterns 208P(31)-208P(33) and 208N(17)-208N(19). Cell 230(2) is DRH standard cell and also is described as three-fin cell, where the three full pairs correspond to fin patterns 208P(34)-208P(36) and 208N(20)-208N(22).

Relative to the Y-axis, cell 212(13) is located so that the bottom side thereof abuts (or is stacked on) the top side of cell 230(1) at a border region 228(13); cell 230(1) is located so that the bottom side thereof abuts the top side of cell 230(2) at a border region 228(15); and cell 230(2) is located so that the bottom side thereof abuts the top side of cell 212(14) at a border region 228(17).

Cell 230(1) is a combination of what otherwise would be a cell 213(5) and a separate cell 211(5) that otherwise would have a border region 228(14) which straddles fin pattern 208N(18). Cell 230(2) is a combination of what otherwise would be a cell 213(6) and a separate cell 211(6) that otherwise would have a border region 228(16) which straddles fin pattern 208N(21).

Relative to the Y-axis, there is: a gap 226(15) between a bottom end of gate pattern 217(7) and a top end of gate pattern 216(5); a gap 226(16) between a bottom end of gate pattern 216(5) and a top end of gate pattern 216(6); and a gap 226(17) between a bottom end of gate pattern 216(6) and a top end of gate pattern 219(5).

The bottom end of gate pattern 217(7) extends toward the bottom border of cell 212(13) sufficiently far to overlap fin pattern 208P(30). The bottom end of gate pattern 216(5) extends toward the bottom border of cell 230(1) sufficiently far to overlap fin pattern 208P(33). The bottom end of gate pattern 216(6) extends toward the bottom border of cell 230(2) sufficiently far to overlap fin pattern 208P(36).

Border region 228(13) straddles fin pattern 208P(30). Border region 228(15) straddles fin pattern 208P(33). Border region 228(17) straddles fin pattern 208P(36). By contrast, according to the other approach, no gate pattern would be permitted to overlap fin pattern 208P(30), nor fin pattern 208P(33), nor fin pattern 208P(36). By encroaching upon cell 230(1), cell 230 provides a three-fin cell having a double row-height (DRH), which avoids wasted space otherwise incurred according to the other approach. By encroaching upon cell 230(1), cell 230(2) provides a three-fin cell having a double row-height (DRH), which avoids wasted space otherwise incurred according to the other approach. Similarly, by encroaching upon cell 230(1), cell 212(13) avoids wasted space otherwise incurred according to the other approach.

In some embodiments, fin pattern 208P(30) is optional as indicated by the dashed outline of fin pattern 208P(30). In some embodiments, where fin pattern 208P(30) is not included, portion 218(5) of gate pattern 217(7) correspondingly is not included such that portion 218(5) is optional as indicated by the dashed outline of portion 218(5).

Figure 2H:
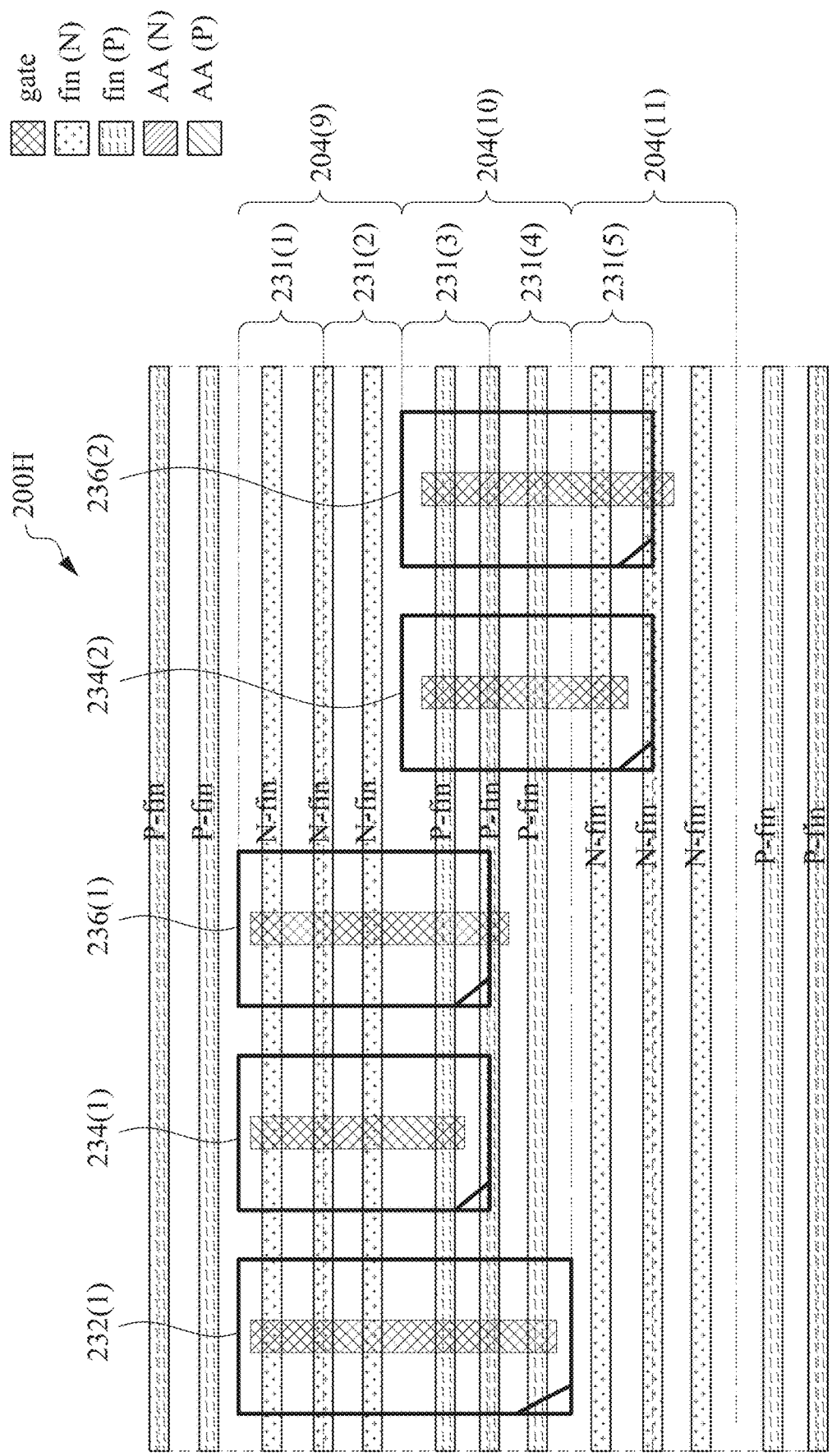

Turning to FIG. 2H, layout diagram 200H includes cells 232(1), 234(1), 234(2), 236(1) and 236(2). In addition to rows 204(9), 204(10) and 204(11), layout diagram is organized according to half-rows 231(1)-231(5). Row 204(9) includes half-rows 231(1) and 231(2). Row 204(10) includes half-rows 231(3) and 231(4). Row 204(11) includes half-rows 231(4) and 231(5). As part of a repeating sequence, half-rows 231(1) and 231(2) have fin patterns for NMOS configuration (N-fin patterns), and half-rows 231(3) and 231(4) have fin patterns for PMOS configuration (P-fin patterns). In some embodiments, the repeating sequence is the opposite, with half-rows 231(3) and 231(4) having P-fin patterns and half-rows 231(2) and 231(3) having N-fin patterns. In some embodiments, a yet different sequence of N-fin patterns and P-fin patterns.

In FIG. 2H, relative to the Y-axis, each of cells 232(1), 234(1), 234(2), 236(1) and 236(2) is offset by a half-row relative to a full row. Cell 232(1) is a double row-height (DRH) cell and is located across half-rows 231(1)-231(4). Each of cells 234(1) and 236(1) is a 1.5 row-height (or three-halves row-height (THRH)) cell and is located across half-rows 231(1)-231(3). Each of cells 234(2) and 236(2) is a THRH cell and is located across half-rows 231(3)-231(5).

Cell 232(1) is a three-fin cell and includes three N-fins and three P-fins. Cell 234(1) is a variation of a two-fin cell and includes three N-fins and one P-fin. Cell 234(2) also is a variation of a two-fin cell and includes one N-fin and three P-fins. Cell 236(1) is a variation of a 2.5-fin cell and includes three N-fins and two P-fins. Cell 236(2) also is a variation of a 2.5-fin cell and includes two N-fins and three P-fins.

FIGS. 3A-3C are corresponding layout diagrams 300A-300C, in accordance with some embodiments.

Layout diagrams 300A-300C are similar to layout diagrams 200B-200G of corresponding FIGS. 2A-2G. FIGS. 3A-3C follow a similar numbering convention to that of FIGS. 2A-2H. Though corresponding, some components also differ. Whereas FIGS. 2A-2H use 2-series numbers, FIGS. 3A-3C use 3-series numbers. To help identify components which correspond but nevertheless have differences, the numbering convention uses parenthetical numbers. For example, cell 310(5) of FIG. 3A and cell 210(4) of FIG. 2F are both one-fin cells, with similarities being reflected in the common root 10(_) and with the differences being reflected in the series number 3_(_) and 2_(_), and in the parentheticals _(5) and _(4). For brevity, the discussion will focus more on differences between FIGS. 3A-3H and FIGS. 2A-2F than on similarities.

Cell 310(5) further includes an MD pattern 340(1), a VD pattern 342(1) and a M0 pattern 344(1), as compared to cell 210(4) of FIG. 2F. Cell 311(5) further includes an MD pattern 340(2), a VD pattern 342(2) and a M0 pattern 344(2), as compared to cell 211(4) of FIG. 2D. M0 patterns 344(1)-34(2) have corresponding long axes extending substantially parallel to the X-axis. MD patterns 340(1)-340(2) have corresponding long axes extending substantially parallel to the Y-axis.

The fin patterns (not numbered in FIG. 3A), MD patterns 340(1)-340(2), the gate patterns (not numbered in FIG. 3A), and VD patterns 342(1)-342(2) are included in a transistor level of layout diagram 300A, which corresponds to a transistor layer of a semiconductor device based on layout diagram 300A. M0 patterns 344(1)-344(2) are included in a level M0 of metallization in layout diagram 300A, which corresponds to a layer M0 of metallization of a semiconductor device based on layout diagram 300A.

In layout diagram 300A, MD patterns 340(1)-340(2) represent corresponding MD conductive structures in a transistor layer of a semiconductor device based on layout diagram 200A. The gate patterns (not numbered in FIG. 3A) represent corresponding gate structures in a transistor layer of a semiconductor device based on layout diagram 300A. VD patterns 342(1)-342(2) represent corresponding VD structures in a transistor layer of a semiconductor device based on layout diagram 200A. A VD structure (see FIG. 4B) electrically couples a drain/source structure to a corresponding M0 conductive segment. M0 patterns 344(1)-344(2) represent corresponding conductive segments in layer M0 of metallization of a semiconductor device based on layout diagram 200A.

Layout diagram 300A assumes a corresponding semiconductor process technology node which includes various design rules for generating a layout diagram. Layout diagram 300A further assumes that the design rules follow a numbering convention in which a first level of metallization (M_1st) and a corresponding first level of interconnect structures (V_1st) are referred to correspondingly as M0 and V0. Level M0 of layout diagram 300A correspondingly represents layer M0 of metallization in a semiconductor device based on layout diagram 300A. In some embodiments, the numbering convention assumes that the M_1st level and the V_1st level are referred to correspondingly as M1 and V1.

In the example of FIG. 3A, it is assumed that: M0 patterns 344(1)-344(2) are power grid (PG) patterns that represent corresponding conductors in a power grid of a semiconductor device which is fabricated based on layout diagram 300A. In some embodiments, PG patterns 244(1)-344(2) designated for providing a system reference voltage. In FIG. 3A, PG patterns 344(1)-344(2) are designated for providing VDD. In some embodiments, PG patterns 344(1)-344(2) are designated for providing corresponding voltages other than VDD.

In layout diagram 300A, relative to the Y-axis, it is contemplated that cell 310(5) is to be located so that the bottom side thereof abuts (or is stacked on) the top side of cell 311(5), as indicated by phantom round-cornered rectangle 346(1). However, in such an abutted arrangement, M0 patterns 344(1) and 344(2) would be merged with a result that VD pattern 342(1) would represent a shorted electrical coupling (short circuit) across the fin pattern which straddles the top border of cell 311(5). To avoid the short-circuit, an alternate arrangement of cell 310(5) is provided in layout diagram 300B of FIG. 3B as cell 310(6).

Turning to FIG. 3B, MD pattern 340(3) and VD pattern 342(3) of cell 310(6) have replaced correspondingly MD pattern 340(1) and VD pattern 342(1) of cell 310(5) of FIG. 3A. MD pattern 340(3) and VD pattern 342(3) are located to the left side of the gate pattern in cell 310(6), whereas MD pattern 340(1) and VD pattern 342(1) are located to the right of the gate pattern in cell 310(5). In layout diagram 300B, relative to the Y-axis, it is contemplated that cell 310(6) is to be located so that the bottom side thereof abuts (or is stacked on) the top side of cell 311(5), as indicated by phantom round-cornered rectangle 346(2). In such an abutted arrangement, the short circuit is avoided.

FIG. 3C shows the abutted arrangement resulting from FIG. 2B. In layout diagram 300C, MD patterns 340(2)-340(3) of layout diagram 300B have been merged as MD pattern 340(4). In layout diagram 300C, VD patterns 342(2)-342(3) of layout diagram 300B have been merged as VD pattern 342(4). In layout diagram 300C, M0 patterns 344(2)-342(3) of layout diagram 300B have been merged as M0 pattern 344(4).

Figure 4A:
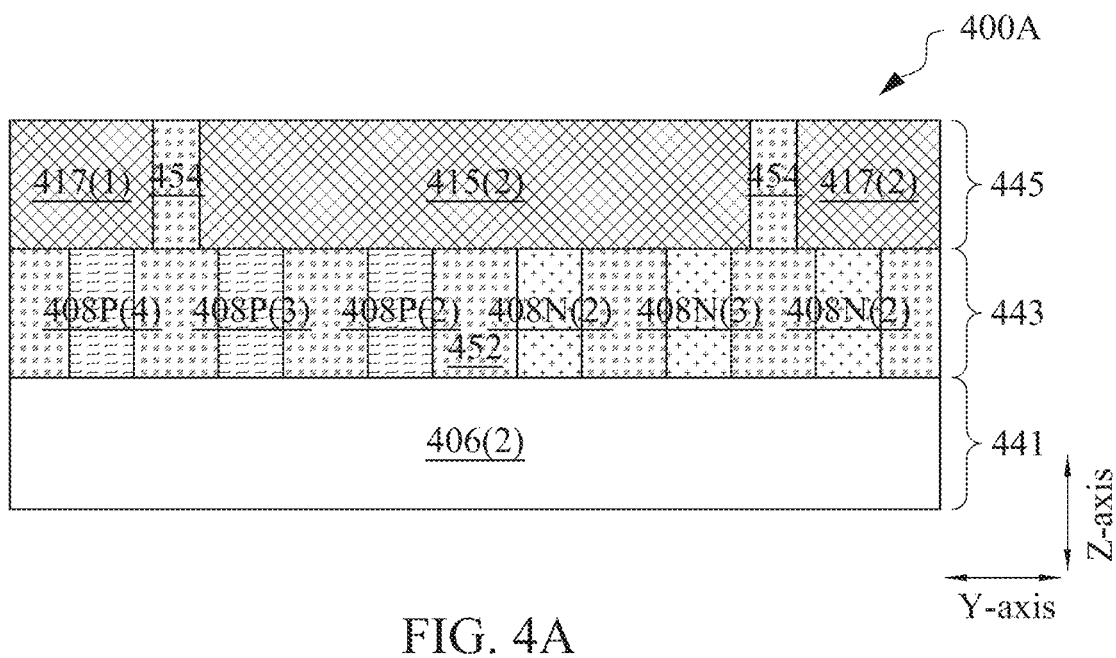
FIGS. 4A-4B are corresponding cross-sectional views 400A-400B, in accordance with some embodiments.
Figure 4B:
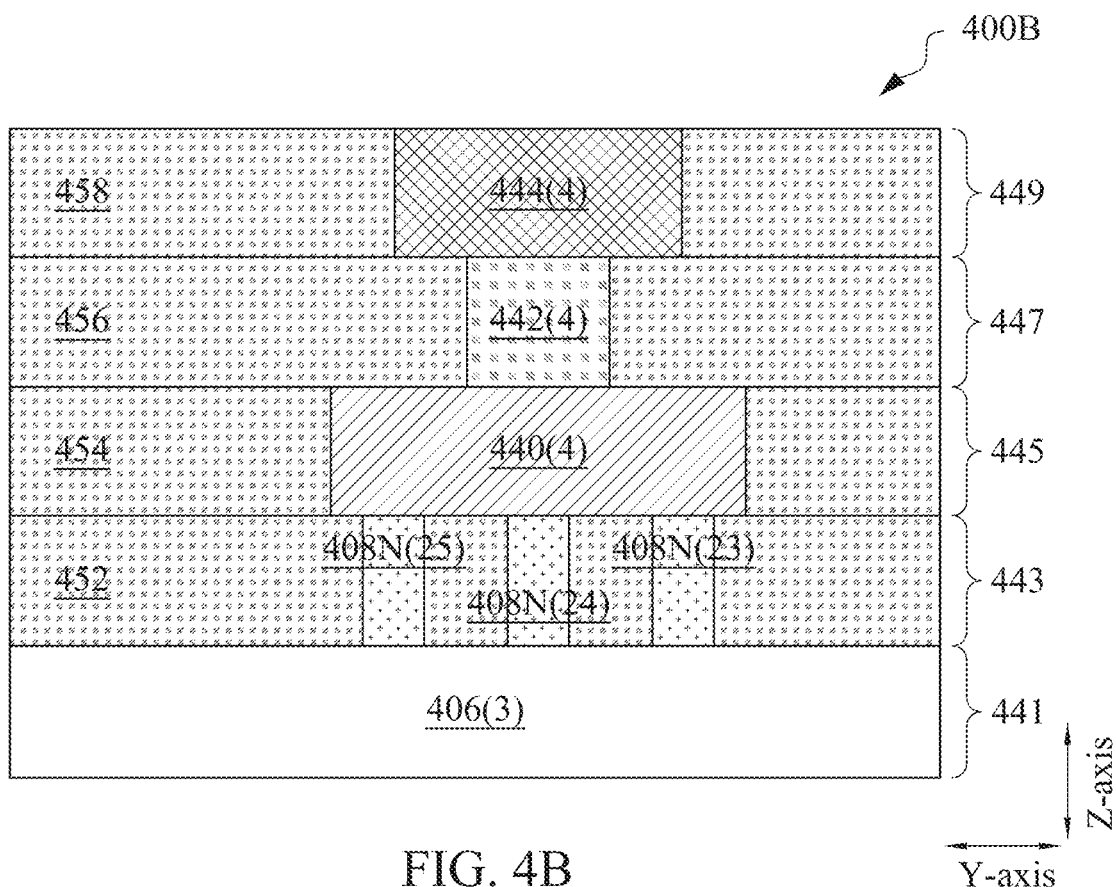

FIGS. 4A-4B are corresponding cross-sectional views 400A-400B of corresponding parts of corresponding semiconductor devices, in accordance with some embodiments.

More particularly, cross-sectional view 400A shows parts of a semiconductor device based on layout diagram 200B of FIG. 2B. Cross-sectional view 400B shows parts of a semiconductor device based on layout diagram 300C of FIG. 3C. The cross-sectional views 400A-400B and the semiconductor device including the same are corresponding examples of cell region 104 and semiconductor device 100 of FIG. 1.

FIGS. 4A-4B assume an orthogonal XYZ coordinate system in which the X-axis, Y-axis and Z-axis represent corresponding first, second and third directions. In some embodiments, the first, second and third directions correspond to a different orthogonal coordinate system than the XYZ coordinate system.

Cross-sectional view 400A follows a similar numbering convention to that of FIG. 2B. Whereas FIG. 2B uses 2-series numbers, FIG. 4A uses 4-series numbers. For example, 408N(4) of FIG. 4A corresponds to gate pattern 208N(4) of FIG. 2B. Cross-sectional view 400B follows a similar numbering convention to that of FIG. 3C. Whereas FIG. 3C uses 3-series numbers, FIG. 4B uses 4-series numbers. For example, fin 408N(23) of FIG. 4B corresponds to fin pattern 308N(23) of FIG. 3C.

In FIG. 4A, cross-sectional view 400A includes sub-layers 441, 443 and 445. In FIG. 4B, cross-sectional view 400A includes sub-layers 441, 443, 445, 447 and 449.

In FIG. 4A, sub-layer 441 includes a substrate 406(2). Sub-layer 443 includes fins 408N(1), 408N(3), 408N(4), 408P(2), 408P(3) and 408P(4), and an interlayer dielectric (ILD) 452. Sub-layer 445 includes gate electrodes 417(1), 415(2) and 417(2), and an ILD 454.

In FIG. 4B, sub-layer 441 includes a substrate 406(3). Sub-layer 443 includes fins 408N(25), 408N(24) and 408N(23), and ILD 452. Sub-layer 445 includes MD contact 440(4), and ILD 454. Sub-layer 447 includes a VD structure 442(4) and an ILD 456. Sub-layer 449 includes a M0 conductive segment 444(4), and an ILD 458.

Figure 5:
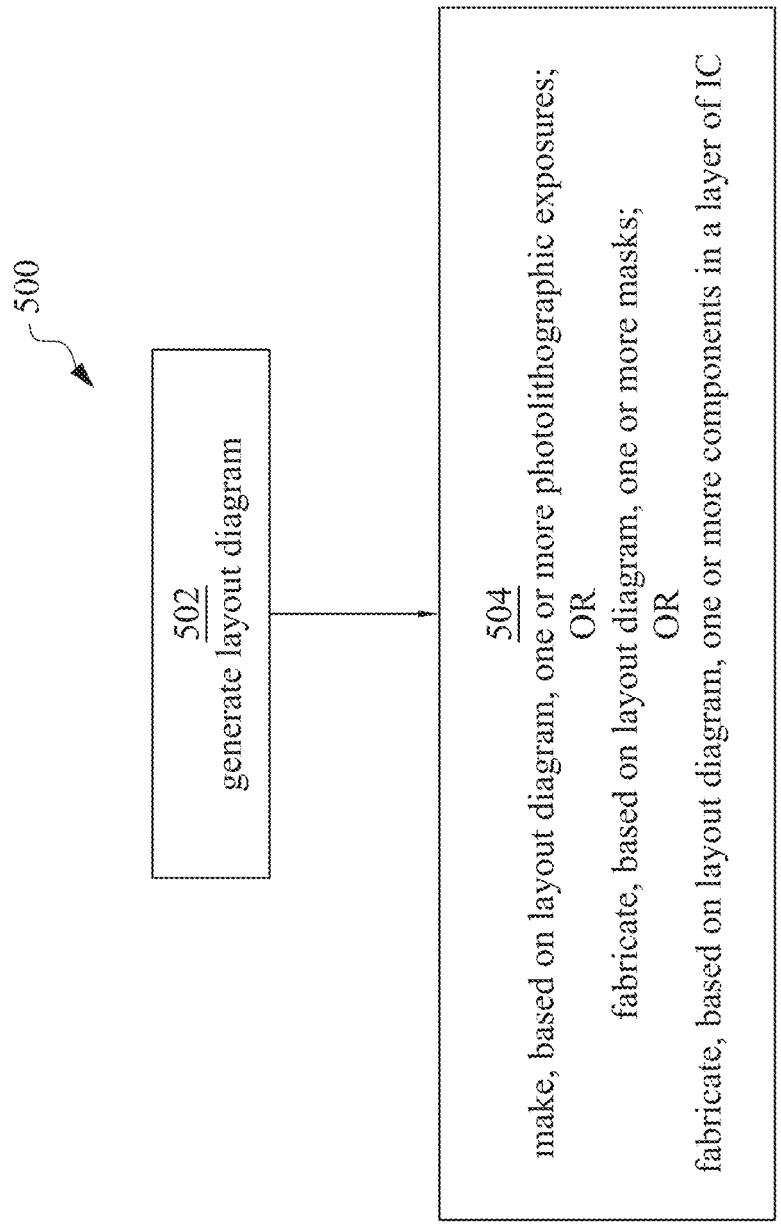
FIG. 5 is a flowchart of a method, in accordance with some embodiments.

FIG. 5 is a flowchart of a method 500 of manufacturing a semiconductor device, in accordance with some embodiments.

Examples of a semiconductor device which can be manufactured according to method 500 include semiconductor device 100 of FIG. 1.

In FIG. 5, method 500 includes blocks 502-504. At block 504, a layout diagram is generated which, among other things, has improved cell density, and correspondingly improved layout diagram density. An example of a semiconductor device corresponding to a layout generated by method 500 includes semiconductor device 100 of FIG. 1. Block 502 is discussed in more detail below with respect to FIG. 6A. From block 502, flow proceeds to block 504.

At block 504, based on the layout diagram, at least one of (A) one or more photolithographic exposures are made or (B) one or more semiconductor masks are fabricated or (C) one or more components in a layer of a semiconductor device are fabricated. See discussion below of FIG. 8.

Figure 6A:
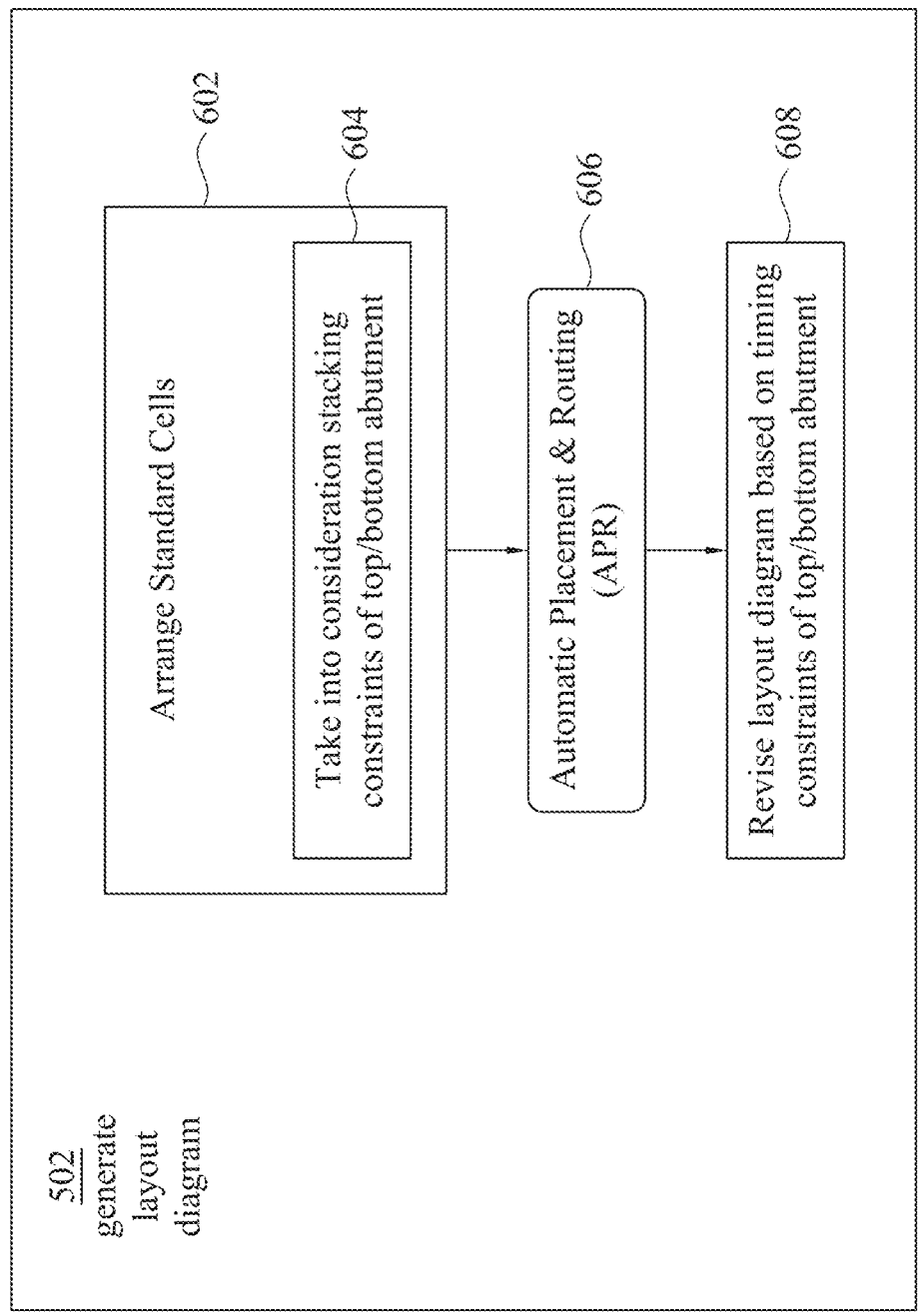
FIGS. 6A-6F are corresponding flowcharts of corresponding methods, in accordance with some embodiments.

FIG. 6A is a flowchart of a method of generating a layout diagram, in accordance with some embodiments.

More particularly, the method of FIG. 6A shows block 502 of FIG. 5 in more detail, in accordance with one or more embodiments.

Examples of layout diagrams which can be generated according to the method of FIG. 6A include the layout diagrams disclosed herein, or the like. In some embodiments, the layout diagrams and corresponding versions thereof are stored on a non-transitory computer-readable medium, e.g., stored as layout diagram(s) 708 in computer-readable medium 704 of FIG. 7 (discussed below). The method of FIG. 6A is implementable, for example, using EDA system 700 (FIG. 7, discussed below), in accordance with some embodiments. Examples of a semiconductor device which can be manufactured based on layout diagrams generated according to the method of FIG. 6A include semiconductor device 100 FIG. 1, and semiconductor devices based on layout diagrams 200A-200H and 300B-300C or the like.

In FIG. 6A, block 502 includes blocks 602-608. At block 602, standard cells are arranged into a layout diagram. Block 602 includes block 604. At block 604, stacking constraints with respect to top/bottom boundary abutment of cells are taken into consideration. An example of the top/bottom boundary constraints being taken into consideration is FIGS. 3A-3C, or the like. Block 602 is discussed in more detail below with respect to FIGS. 6B-6F. From block 602, flow proceeds to block 606.

At block 604, the layout diagram is subjected to automatic placement and routing (APR). From block 604, flow proceeds to block 606.

At block 606, the layout diagram is revised in light of timing constraints with respect to top/bottom boundary abutment of cells. In some embodiments, EDA system 700 includes a lookup table (or database) populated with delays associated with each cell type, e.g., cells 210(x), 211(x), 212(x), 213(x), 230(x), 232(x), 234(x) and 236(x) of FIGS. 2A-2H, or the like. In some embodiments, EDA system 700 includes a lookup table (or database) populated with delays associated with each particular cell, e.g., cells 210(4), 211(4), 212(14), 213(4), 214(x), 230(1), 232(1), 234(1), 236(1), or the like. Relative delay similarities/disparities are taken into consideration when assessing a top/bottom (or vice-versa) boundary abutment of cells.

Figure 6B:
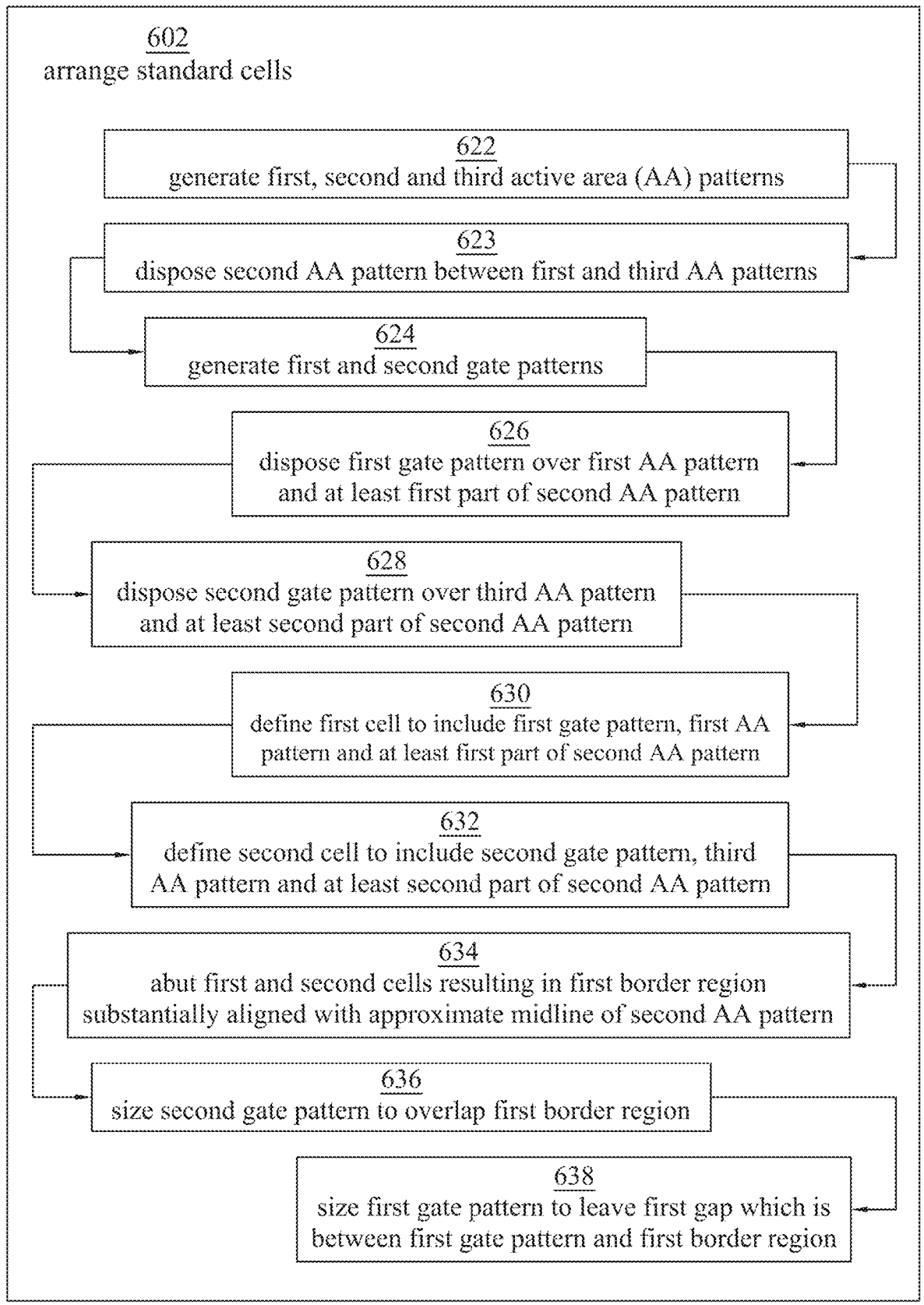

FIG. 6B is a flowchart of a method of generating a layout diagram, in accordance with some embodiments.

More particularly, the method of FIG. 6B shows block 602 of FIG. 6A in more detail, in accordance with one or more embodiments.

In FIG. 6B, block 604 includes blocks 622-638. At block 620, first, second and third active area patterns are generated. In some embodiments, each of the first, second and third active area patterns is represented by one or more corresponding fin patterns. An example of the first active area pattern is fin pattern 208P(7) of FIG. 2C, or the like. An example of the second active area pattern are fin patterns 208N(5), 208N(6) and 208N(7) of FIG. 2C, or the like. An example of the third active area pattern is fin pattern 208P(8) of FIG. 2C, or the like. From block 622, flow proceeds to block 623.

At block 623, relative to the Y-axis, the second active area pattern is located between the first and third active area patterns. Continuing the example begun above in the context of block 622, an example of block 624 is that fin patterns 208N(5), 208N(6) and 208N(7) of FIG. 2C are located between fin patterns 208P(7) and 208P(8) of FIG. 2C. From block 623, flow proceeds to block 624.

At block 624, first and second gate patterns are generated. Continuing the example developed above in the context of block 623, examples of the first and second gate patterns include gate patterns 214(3) and 215(3) of FIG. 2C, or the like. From block 624, flow proceeds to block 626.

At block 626, the first gate pattern is located of the first active area pattern and at least a first part of the second active area pattern. Continuing the example developed above in the context of block 624, an example of block 626 is that gate pattern 214(3) of FIG. 2C is located over fin pattern 208P(7) and one of fin patterns 208N(5), 208N(6) and 208N(7), namely fin pattern 208N(5). From block 626, flow proceeds to block 628.

At block 628, the second gate pattern is located of the third active area pattern and at least a second part of the second active area pattern. Continuing the example developed above in the context of block 626, an example of block 628 is that gate pattern 215(3) of FIG. 2C is located over fin pattern 208P(8) and two of fin patterns 208N(5), 208N(6) and 208N(7), namely fin patterns 208N(6) and 208N(7). From block 628, flow proceeds to block 630.

At block 630, a first cell is defined to include the first gate pattern, the first active area pattern and at least the first part of the second active area pattern. Continuing the example developed above in the context of block 628, an example of block 630 is that cell 210(3) of FIG. 2C includes gate pattern 214(3), fin pattern 208P(7) and fin pattern 208N(5). From block 630, flow proceeds to block 632.

At block 632, a second cell is defined to include the second gate pattern, the third active area pattern and at least the second part of the second active area pattern. Continuing the example developed above in the context of block 630, an example of block 632 is that cell 211(3) of FIG. 2C includes gate pattern 215(3), fin pattern 208P(8) and fin patterns 208N(6) and 208N(7). From block 632, flow proceeds to block 634.

At block 634, the first and second cells are abutted which results in a first border region substantially aligned with an approximate midline of the second active area pattern. Continuing the example developed above in the context of block 632, an example of the first border region is border region 228(2). More particularly, relative to the Y-axis, cell 210(3) is abutted on cell 211(3). Relative to the Y-axis, as the middle fin pattern of three fin patterns, fin pattern 208N(6) substantially aligns with an approximate midline of the second active area pattern, where the latter is represented by fin patterns 208N(5), 208N(6) and 208N(7). From block 634, flow proceeds to block 636.

At block 636, the second gate pattern is sized to overlap the first border region. Continuing the example developed above in the context of block 634, an example of block 636 is that, relative to the Y-axis, gate pattern 215(3) is sized to overlap border region 228(2), including fin pattern 208N(6). From block 636, flow proceeds to block 638.

At block 638, the first gate pattern is sized to leave a first gap, the first gap being between the first gate pattern and the first border region. Continuing the example developed above in the context of block 636, an example of block 638 is that, relative to the Y-axis, gate pattern 214(3) is sized to leave gap 226(4), where gap 226(4) is located between a bottom end of gate pattern 214(3) and border region 228(2).

Figure 6C:
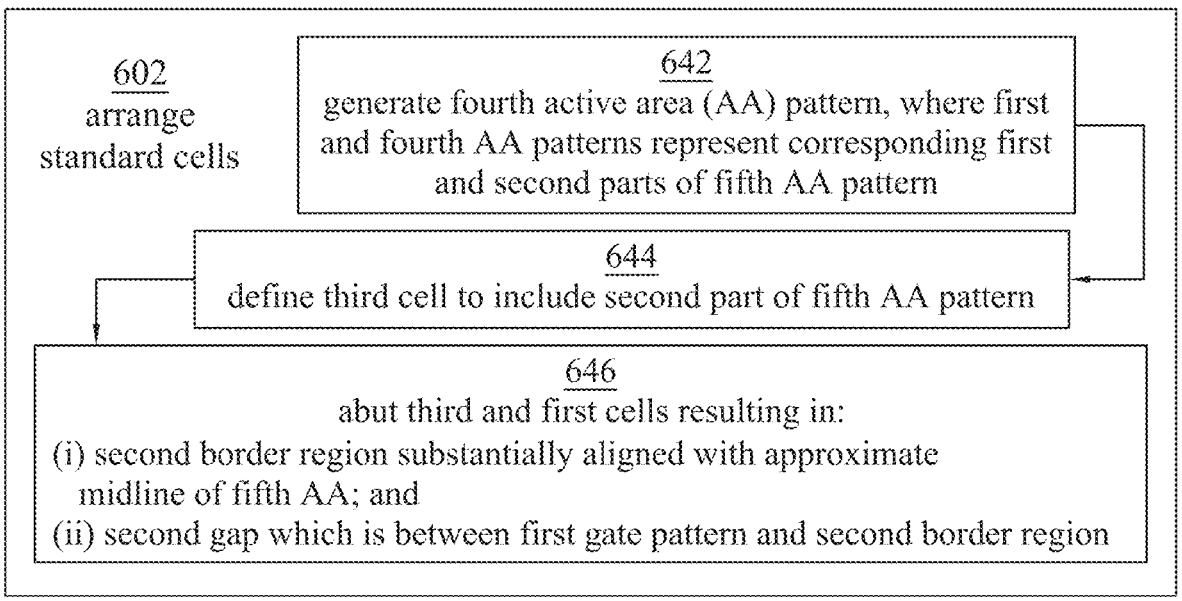

FIG. 6C is a flowchart of a method of generating a layout diagram, in accordance with some embodiments.

More particularly, the method of FIG. 6C shows additional blocks included in block 602 of FIG. 6B, in accordance with one or more embodiments.

In FIG. 6C, block 602 further includes blocks 642-646. At block 642, a fourth active area pattern is generated, where the first and fourth active area patterns represent corresponding first and second parts of a fifth active area pattern. Continuing the example developed above in the context of block 638 of FIG. 6B, an example of the fourth active area pattern are fin patterns 208P(5) and 208P(6) of FIG. 2C. Accordingly, fin pattern 208P(7) represents the first part of the fifth active area pattern, and fin patterns 208P(5) and 208P(6) represent the second part of the fifth active area pattern. From block 642, flow proceeds to block 644.

At block 644, a third cell is defined to include the second part of the fifth active area pattern. Continuing the example developed above in the context of block 642, an example of block 644 is that cell 212(5) includes fin patterns 208P(5) and 208P(6). From block 644, flow proceeds to block 646.

At block 646, the third and first cells are abutted which results in (i) a second border region substantially aligned with an approximate midline of the fifth active area pattern, (ii) a second gap, the second gap being between the first gate pattern and the second border region. Continuing the example developed above in the context of block 644, an example of the second border region is border region 228(1). More particularly, relative to the Y-axis, cell 212(5) is abutted on cell 210(3). Relative to the Y-axis, as the middle fin pattern of three fin patterns, fin pattern 208P(6) substantially aligns with an approximate midline of the fifth active area pattern, where the latter is represented by fin patterns 208P(5), 208P(6) and 208P(7). Also, gate pattern 214(3) is sized to leave gap 226(3), where gap 226(3) is located between a bottom end of gate pattern 217(3) and border region 228(1).

Figure 6D:
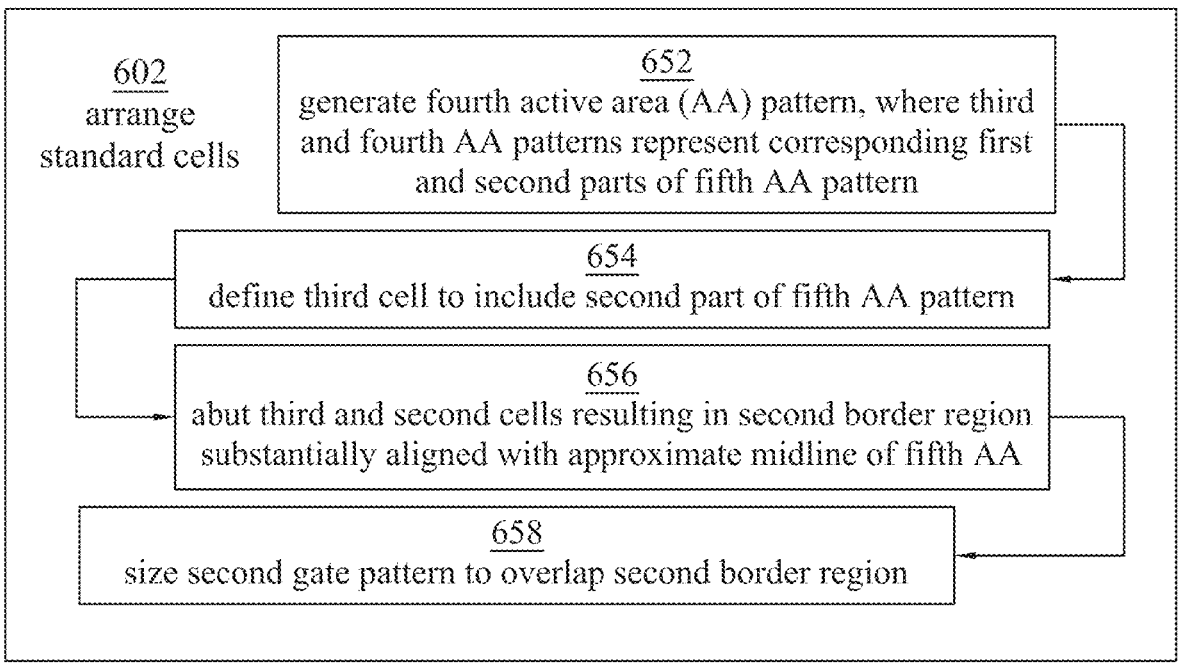

FIG. 6D is a flowchart of a method of generating a layout diagram, in accordance with some embodiments.

More particularly, the method of FIG. 6D shows additional blocks included in block 602 of FIG. 6B, in accordance with one or more embodiments.

In FIG. 6D, block 602 further includes blocks 652-658. At block 652, a fourth active area pattern is generated, where the third and fourth active area patterns represent corresponding first and second parts of a fifth active area pattern. Continuing the example developed above in the context of block 638 of FIG. 6B, an example of the fourth active area pattern are fin patterns 208P(9) and 208P(10) of FIG. 2C. Accordingly, fin pattern 208P(8) represents the first part of the fifth active area pattern, and fin patterns 208P(9) and 208P(10) represent the second part of the fifth active area pattern. From block 652, flow proceeds to block 654.

At block 654, a third cell is defined to include the second part of the fifth active area pattern. Continuing the example developed above in the context of block 652, an example of block 654 is that cell 212(6) includes fin patterns 208P(9) and 208P(10). From block 654, flow proceeds to block 656.

At block 656, the third and second cells are abutted which results in a second border region substantially aligned with an approximate midline of the fifth active area pattern. Continuing the example developed above in the context of block 654, an example of the second border region is border region 228(3). More particularly, relative to the Y-axis, cell 211(3) is abutted on cell 212(6). Relative to the Y-axis, as the middle fin pattern of three fin patterns, fin pattern 208P(9) substantially aligns with an approximate midline of the fifth active area pattern, where the latter is represented by fin patterns 208P(8), 208P(9) and 208P(10). From block 656, flow proceeds to block 658.

At block 658, the second gate pattern is sized to overlap the second border region. Continuing the example developed above in the context of block 656, an example of block 658 is that gate pattern 215(3) is sized to overlap border region 228(3), including fin pattern 208P(9).

Figure 6E:
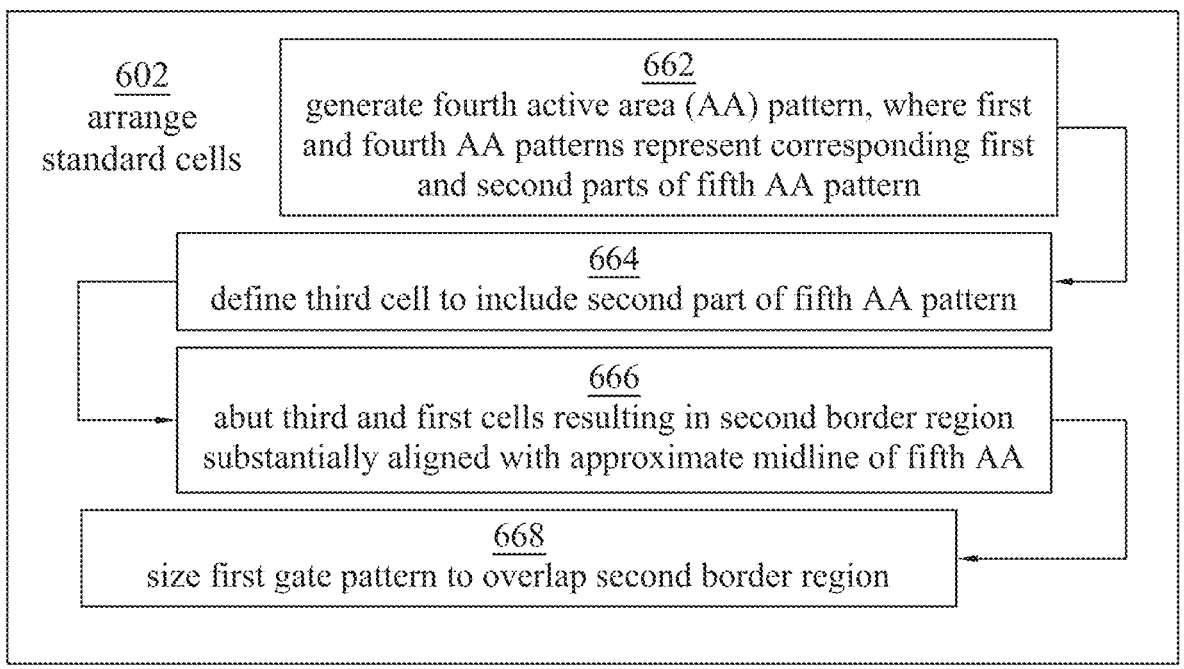

FIG. 6E is a flowchart of a method of generating a layout diagram, in accordance with some embodiments.

More particularly, the method of FIG. 6E shows additional blocks included in block 602 of FIG. 6B, in accordance with one or more embodiments.

In FIG. 6E, block 602 further includes blocks 662-668. At block 662, a fourth active area pattern is generated, where the first and fourth active area patterns represent corresponding first and second parts of a fifth active area pattern. An example of the first active area pattern fin patterns 208P(12) and 208P(13) of FIG. 2D. An example of the fourth active area pattern is fin pattern 208P(11) of FIG. 2D. Accordingly, fin patterns 208P(12) and 208P(13) represent the first part of the fifth active area pattern, and fin pattern 208P(11) represents the second part of the fifth active area pattern. From block 662, flow proceeds to block 664.

At block 664, a third cell is defined to include the second part of the fifth active area pattern. Continuing the example developed above in the context of block 662, an example of the third cell is cell 212(7), and so an example of block 664 is that cell 212(7) includes fin pattern 208P(11). From block 664, flow proceeds to block 666.

At block 666, the third and first cells are abutted which results in a second border region substantially aligned with an approximate midline of the fifth active area pattern. Continuing the example developed above in the context of block 664 which also is in the context of FIG. 2D, an example of the first cell is cell 213(1), an example of the first border region is border region 228(5), and an example of the second border region is border region 228(4). More particularly, relative to the Y-axis, cell 212(7) is abutted on cell 213(1). Relative to the Y-axis, as the middle fin pattern of three fin patterns, fin pattern 208P(12) substantially aligns with an approximate midline of the fifth active area pattern, where the latter is represented by fin patterns 208P(11), 208P(12) and 208P(13). From block 666, flow proceeds to block 668.

At block 668, the first gate pattern is sized to overlap the second border region. Continuing the example developed above in the context of block 666, an example of the first gate pattern is gate pattern 216(1), and so an example of block 668 is that gate pattern 216(1) is sized to overlap border region 228(4), including fin pattern 208P(12).

Figure 6F:
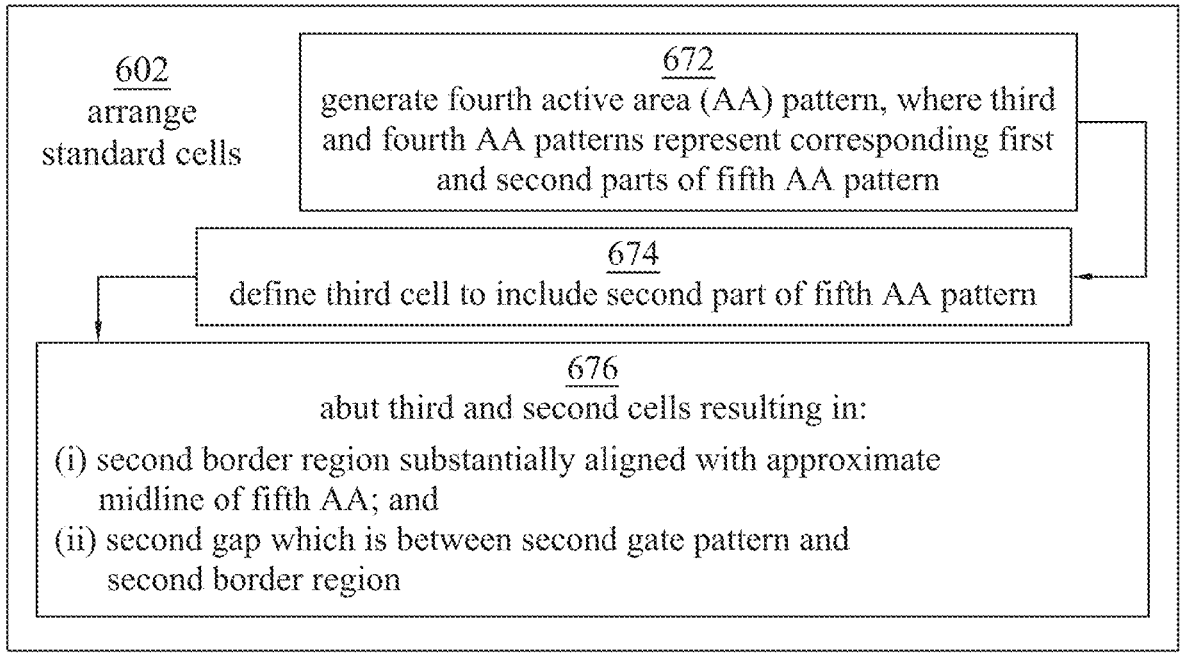

FIG. 6F is a flowchart of a method of generating a layout diagram, in accordance with some embodiments.

More particularly, the method of FIG. 6F shows additional blocks included in block 602 of FIG. 6B, in accordance with one or more embodiments.

In FIG. 6F, block 602 further includes blocks 672-676. At block 672, a fourth active area pattern is generated, where the third and fourth active area patterns represent corresponding first and second parts of a fifth active area pattern. Continuing the example developed above in the context of block 638 of FIG. 6B, an example of the third active area pattern is fin pattern 208P(19), and an example of the fourth active area pattern are fin patterns 208P(17) and 208P(18) of FIG. 2E. Accordingly, fin pattern 208P(19) represents the first part of the fifth active area pattern, and fin patterns 208P(17) and 208P(18) represent the second part of the fifth active area pattern. From block 672, flow proceeds to block 674.

At block 674, a third cell is defined to include the second part of the fifth active area pattern. Continuing the example developed above in the context of block 672, an example of the third cell is cell 212(11), and so an example of block 674 is that cell 212(11) includes fin patterns 208P(17) and 208P(18). From block 674, flow proceeds to block 676.

At block 676, the third and second cells are abutted which results in (i) a second border region substantially aligned with an approximate midline of the fifth active area pattern, (ii) a second gap, the second gap being between the second gate pattern and the second border region. Continuing the example developed above in the context of block 674, examples of the first and second gate patterns are correspondingly gate patterns 216(3) and 216(2), an example of the first border region is border region 228(8), and an example of the second border region is border region 228(7). More particularly, relative to the Y-axis, cell 212(11) is abutted on cell 213(2). Relative to the Y-axis, as the middle fin pattern of three fin patterns, fin pattern 208P(18) substantially aligns with an approximate midline of the fifth active area pattern, where the latter is represented by fin patterns 208P(17), 208P(18) and 208P(19). Also, gate pattern 216(2) is sized to leave gap 226(9), where gap 226(9) is located between a bottom end of gate pattern 217(4) and border region 228(7).

Figure 7:
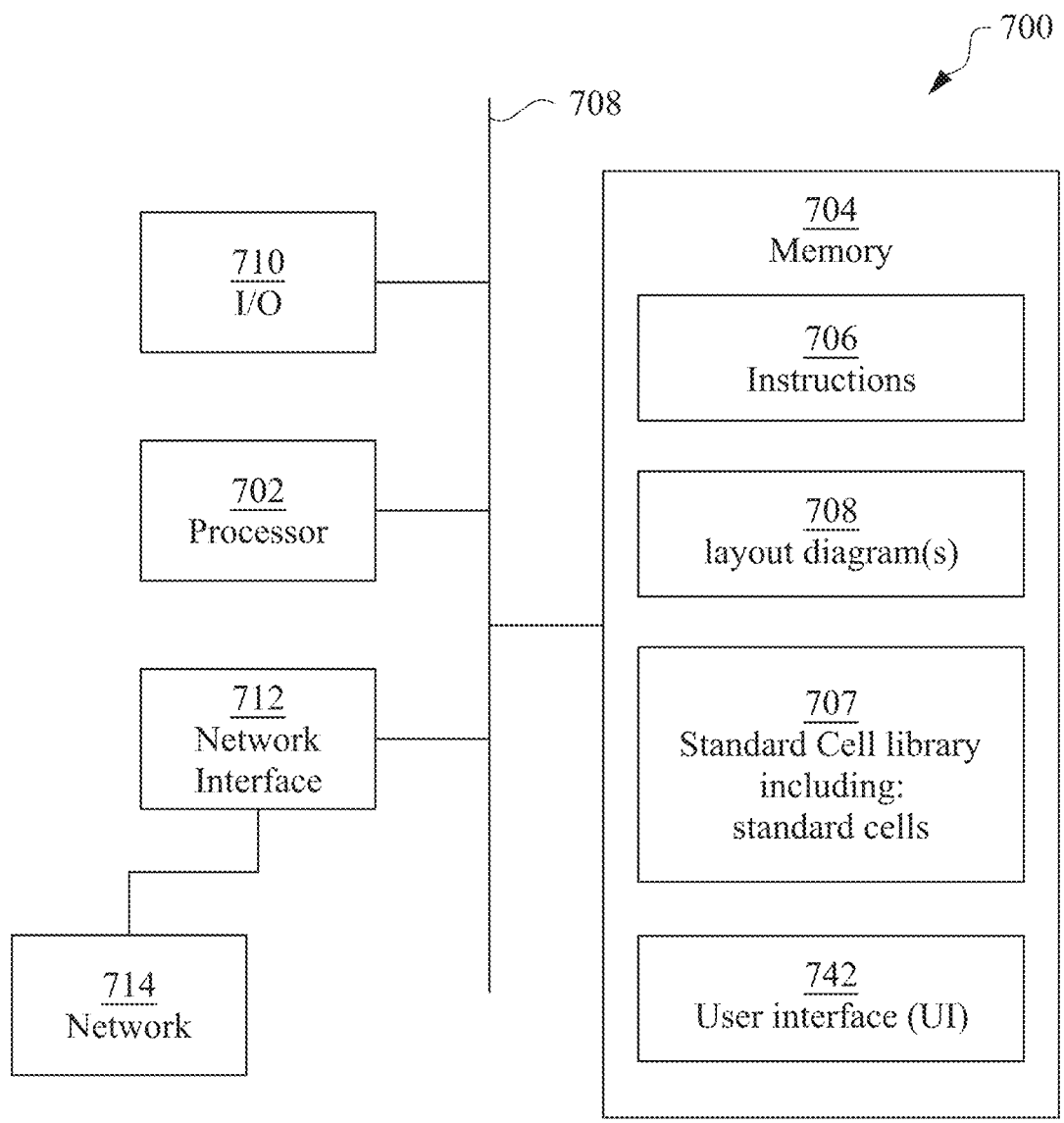
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an automatic placement and routing (APR) system. Methods described herein of generating PG layout diagrams, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of a method according to an embodiment, e.g., the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code (instructions) 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein and one or more layout diagrams 708 such as are disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods are implemented as a software application running on EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
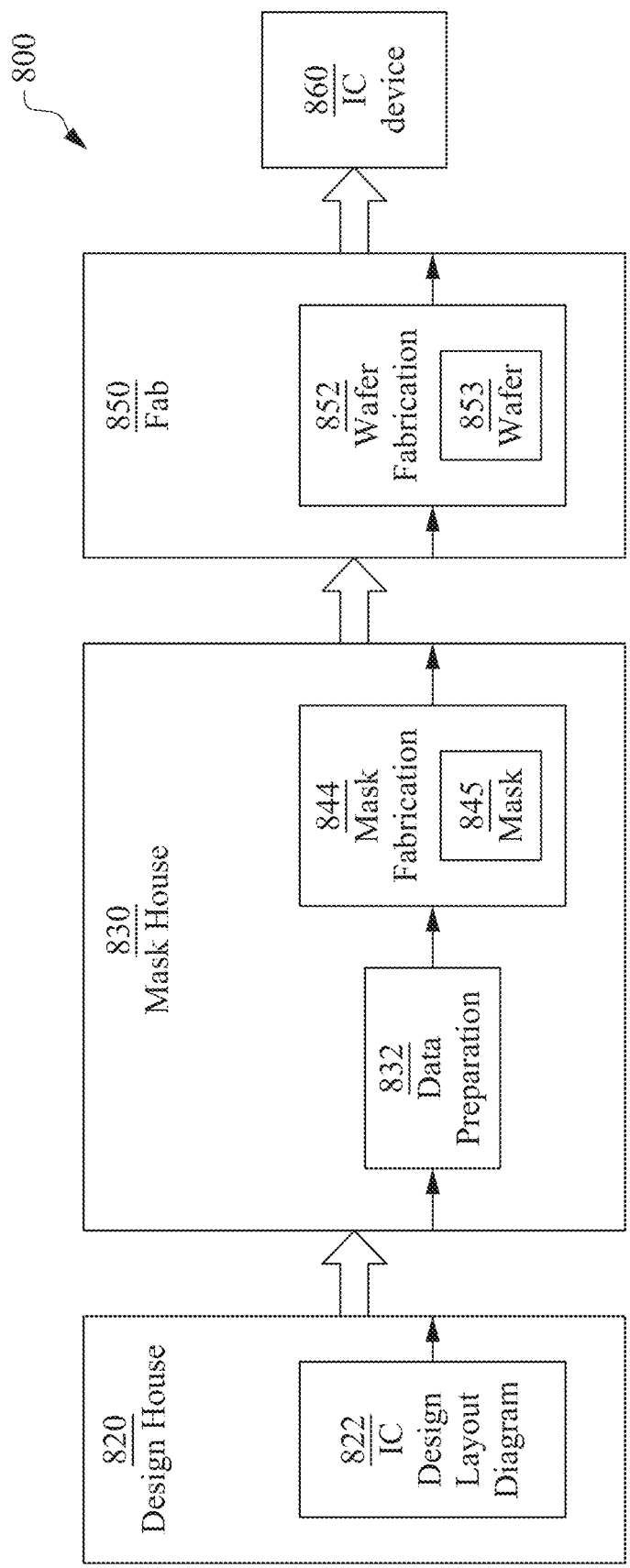
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In an embodiment, a semiconductor device includes: first, second and third active regions having corresponding first, second and the first conductivity configurations, and having corresponding long axes extending substantially in a first direction; relative to a second direction substantially perpendicular to the first direction, the second active region being between the first and third active regions; first and second gate structures having corresponding long axes extending substantially in the second direction; the first gate structure being over the first active region and at least a first part of the second active region; the second gate structure being over the third active region and at least a second part of the second active region; a first cell region including the first gate structure, the first active region and the first part of the second active region; a second cell region including the second gate structure, the third active region and the second part of the second active region; relative to the second direction, a first border region representing an overlap of the first and second cell regions which is substantially aligned with an approximate midline of the second active region; and relative to the second direction: the second gate structure overlapping the first border region; and the first gate structure not extending to the first border region. In an embodiment, the first, second and third active regions are configured with corresponding one or more fin structures having corresponding long axes extending substantially in a first direction. In an embodiment, the first and second conductivity configurations correspondingly are PMOS and NMOS; or the first and second conductivity configurations correspondingly are NMOS and PMOS. In an embodiment, the first active region represents a first part of a fourth active region, the fourth active region having the first conductivity configuration; the semiconductor device further includes: a third cell region including a second part of the fourth active region; and relative to the second direction: an approximate midline of the fourth active region representing a second border region which is between the first and third cell regions; and the first gate structure not extending to the second border region. In an embodiment, the third active region represents a first part of a fourth active region, the fourth active region having the first conductivity configuration; the semiconductor device further includes a third cell region including a second part of the fourth active region; and relative to the second direction: an approximate midline of the fourth active region representing a second border region which is between the first and third cell regions; and the second gate structure overlaps the second border region. In an embodiment, the first active region represents a first part of a fourth active region, the fourth active region having the first conductivity configuration; the semiconductor device further includes a third cell region including a second part of the fourth active region; and relative to the second direction: an approximate midline of the fourth active region representing a second border region which is between the first and third cell regions; and the first gate structure overlaps the second border region. In an embodiment, the third active region represents a first part of a fourth active region, the fourth active region having the first conductivity configuration; the semiconductor device further includes a third cell region including a second part of the fourth active region; and relative to the second direction: an approximate midline of the fourth active region representing a second border region which is between the third and second cell regions; and the second gate structure not extending to the second border region. In an embodiment, the second cell region further includes a fourth active region which represents a first part of a fifth active region, the fourth and fifth active regions having the second conductivity configuration; and a third cell region including a second part of the fifth active region; relative to the second direction: an approximate midline of the fifth active region representing a second border region which is between the first and third cell regions; and the second gate structure not extending to the second border region; the first cell region further includes a sixth active region which represents a first part of a seventh active region, the sixth and seventh active regions having the second conductivity configuration; a fourth cell region including a second part of the seventh active region; and relative to the second direction: an approximate midline of the seventh active region representing a third border region which is between the first and fourth cell regions; and the first gate structure not extending to the second border region; and the first gate structure overlaps the third border region.

In an embodiment, a method (of manufacturing a semiconductor device) includes (for a layout diagram stored on a non-transitory computer-readable medium, the semiconductor device being based on the layout diagram) generating the layout diagram including: generating first, second and third active area patterns extending substantially parallel to a first direction, and designated for corresponding first, second and the first conductivity types; relative to a second direction substantially perpendicular to the first direction, disposing the second active area pattern between the first and third active area patterns; generating first and second gate patterns having corresponding long axes extending substantially in the second direction; disposing the first gate pattern over the first active area pattern and at least a first part of the second active area pattern; disposing the second gate pattern over the third active area pattern and at least a second part of the second active area pattern; defining a first cell including the first gate pattern, the first active area pattern and the first part of the second active area pattern; defining a second cell including the second gate pattern, the third active area pattern and the second part of the second active area pattern; relative to the second direction, substantially abutting the first and second cells resulting in a first border region which is substantially aligned with an approximate midline of the second active area pattern; and relative to the second direction: sizing the second gate pattern to overlap the first border region; and sizing the first gate pattern to leave a first gap which is between the first gate pattern and the first border region. In an embodiment, the method further includes: based on the layout diagram, at least one of: (A) making one or more photolithographic exposures; (B) fabricating one or more semiconductor masks; or (C) fabricating at least one component in a layer of a semiconductor integrated circuit. In an embodiment, the method further includes: designating the first and second conductivity types correspondingly to be P-type and N-type; or designating the first and second conductivity types correspondingly to be N-type and P-type. In an embodiment, each of the first, second and third active area patterns is represented by one or more corresponding fin patterns. In an embodiment, the generating the layout diagram further includes: generating a fourth active area pattern extending substantially parallel to the first direction, and designated for the first conductivity type; the first and fourth active area patterns representing corresponding first and second parts of a fifth active area pattern; defining a third cell to include the second part of the fifth active area pattern; and relative to the second direction, substantially abutting the third and first cells resulting in: a second border region which is substantially aligned with an approximate midline of the fifth active area pattern; and a second gap which is between the first gate pattern and the second border region. In an embodiment, the generating the layout diagram further includes: generating a fourth active area pattern extending substantially parallel to the first direction, and designated for the first conductivity type; the third and fourth active area patterns representing corresponding first and second parts of a fifth active area pattern; defining a third cell to include the second part of the fifth active area pattern; relative to the second direction, substantially abutting the third and second cells resulting in: a second border region which is substantially aligned with an approximate midline of the fifth active area pattern; and sizing the second gate pattern to overlap the second border region. In an embodiment, the generating the layout diagram further includes: generating a fourth active area pattern extending substantially parallel to the first direction, and designated for the first conductivity type; the first and fourth active area patterns representing corresponding first part and second parts of a fifth active area pattern; defining a third cell to include the second part of the fifth active area pattern; relative to the second direction, substantially abutting the third and first cells resulting in: a second border region which is substantially aligned with an approximate midline of the fifth active area pattern; and sizing the first gate pattern overlap the second border region. In an embodiment, the generating the layout diagram further includes: generating a fourth active area pattern extending substantially parallel to the first direction, and designated for the first conductivity type; the third and fourth active area pattern representing corresponding first and second parts of a fifth active area pattern; and defining a third cell to include the second part of the fifth active area pattern; relative to the second direction, substantially abutting the third and second cells resulting in: a second border region which is substantially aligned with an approximate midline of the fifth active area pattern; and a second gap which is between the second gate pattern and the second border region.

In an embodiment, a system (for manufacturing a semiconductor device) includes at least one processor and at least one memory including computer program code for one or more programs, the at least one memory, the computer program code and the at least one processor being are configured to cause the system to execute (for a layout diagram stored on a non-transitory computer-readable medium, the semiconductor device being based on the layout diagram) generating the layout diagram including: generating first, second and third sets, each set including one or more fin patterns, each fin pattern extending substantially parallel to a first direction being designated for corresponding first, second and the first conductivity types; relative to a second direction substantially perpendicular to the first direction, disposing the second set between the first and third sets; generating first and second gate patterns having corresponding long axes extending substantially in the second direction; disposing the first gate pattern over the first set and at least a first part of the second set; disposing the second gate pattern over the third set and at least a second part of the second set; defining a first cell including the first gate pattern, the first set and the first part of the second set; defining a second cell including the second gate pattern, the third set and the second part of the second set; relative to the second direction, substantially abutting the first and second cells resulting in a first border region which is substantially aligned with an approximate midline of the second set; and relative to the second direction: disposing the second gate pattern to overlap the first border region; and disposing the first gate pattern to leave a first gap which is between the first gate pattern and the first border region. In an embodiment, the system further includes: at least one of: a masking facility configured to fabricate one or more semiconductor masks based on the layout diagram; or a fabricating facility configured to fabricate at least one component in a layer of a semiconductor integrated circuit based on the layout diagram. In an embodiment, the generating the layout diagram further includes: generating a fourth set which represents a first part of a fifth set, the fourth and fifth sets having the second conductivity type; further defining the second cell to include the fourth set; defining a third cell to include a second part of the fifth active region; and relative to the second direction, substantially abutting the third cell and the second cell resulting in: a second border region which is substantially aligned with an approximate midline of the fifth set; and a second gap which is between the second gate pattern and the second border region. In an embodiment, the generating the layout diagram further includes: generating a fourth set which represents a first part of a fifth set; further defining the first cell to include the fourth set, the fourth and fifth sets having the second conductivity type; defining a third cell to include a second part of the fifth active region; relative to the second direction, substantially abutting the third cell and the first cell resulting in: a second border region which is substantially aligned with an approximate midline of the fifth set; and sizing the first gate pattern to overlap the second border region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    for a layout diagram stored on a non-transitory computer-readable medium, the semiconductor device being based on the layout diagram, generating the layout diagram including:
        generating first, second and third active area patterns extending substantially parallel to a first direction, and the first and third active area patterns being designated for a first conductivity type and the second active area pattern being designated for a second conductivity type;
        relative to a second direction substantially perpendicular to the first direction, disposing the second active area pattern between the first and third active area patterns;
        generating first and second gate patterns having corresponding long axes extending substantially in the second direction;
        disposing the first gate pattern over the first active area pattern and at least a first part of the second active area pattern;
        disposing the second gate pattern over the third active area pattern and at least a second part of the second active area pattern;
        defining a first cell including the first gate pattern, the first active area pattern and the first part of the second active area pattern;
        defining a second cell including the second gate pattern, the third active area pattern and the second part of the second active area pattern;
    relative to the second direction, substantially abutting the first and second cells resulting in a first border region which is substantially aligned with an approximate midline of the second active area pattern; and
    relative to the second direction:
        sizing the second gate pattern to overlap the first border region; and
        sizing the first gate pattern to leave a first gap which is between the first gate pattern and the first border region.

2. The method of claim 1, wherein the generating the layout diagram further includes:
    generating a fourth active area pattern extending substantially parallel to the first direction, and designated for the first conductivity type;
        the third and fourth active area pattern representing corresponding first and second parts of a fifth active area pattern; and
    defining a third cell to include the second part of the fifth active area pattern;
    relative to the second direction, substantially abutting the third and second cells resulting in:
        a second border region which is substantially aligned with an approximate midline of the fifth active area pattern; and
    a second gap which is between the second gate pattern and the second border region.

3. The method of claim 1, wherein the generating the layout diagram further includes:
    generating a fourth active area pattern extending substantially parallel to the first direction, and designated for the first conductivity type;
        the first and fourth active area patterns representing corresponding first and second parts of a fifth active area pattern;

defining a third cell to include the second part of the fifth active area pattern; and relative to the second direction, substantially abutting the third and first cells resulting in:
  a second border region which is substantially aligned with an approximate midline of the fifth active area pattern; and
  a second gap which is between the first gate pattern and the second border region.

4. The method of claim 1, wherein the generating the layout diagram further includes:
   generating a fourth active area pattern extending substantially parallel to the first direction, and designated for the first conductivity type;
     the first and fourth active area patterns representing corresponding first part and second parts of a fifth active area pattern;
   defining a third cell to include the second part of the fifth active area pattern;
   relative to the second direction, substantially abutting the third and first cells resulting in:
     a second border region which is substantially aligned with an approximate midline of the fifth active area pattern; and
     sizing the first gate pattern overlap the second border region.

5. The method of claim 1, wherein the generating the layout diagram further includes:
   generating a fourth active area pattern extending substantially parallel to the first direction, and designated for the first conductivity type;
     the third and fourth active area patterns representing corresponding first and second parts of a fifth active area pattern;
   defining a third cell to include the second part of the fifth active area pattern;
   relative to the second direction, substantially abutting the third and second cells resulting in:
     a second border region which is substantially aligned with an approximate midline of the fifth active area pattern; and
     sizing the second gate pattern to overlap the second border region.

6. The method of claim 1, further comprising:
   based on the layout diagram, at least one of:
     (A) making one or more photolithographic exposures;
     (B) fabricating one or more semiconductor masks; or
     (C) fabricating at least one component in a layer of a semiconductor integrated circuit.

7. The method of claim 1, further comprising:
   designating the first and second conductivity types correspondingly to be P-type and N-type; or
   designating the first and second conductivity types correspondingly to be N-type and P-type.

8. The method of claim 1, wherein:
   each of the first, second and third active area patterns is represented by one or more corresponding fin patterns.

9. A system for manufacturing a semiconductor device, the system comprising:
   at least one processor; and
   at least one memory including computer program code for one or more programs;
   wherein the at least one memory, the computer program code and the at least one processor are configured to cause the system to execute:
     for a layout diagram stored on a non-transitory computer-readable medium, the semiconductor device being based on the layout diagram, generating the layout diagram including:
       generating first, second and third sets, each set including one or more fin patterns, each fin pattern extending substantially parallel to a first direction and being designated for corresponding first, second and the first conductivity types;
       relative to a second direction substantially perpendicular to the first direction, disposing the second set between the first and third sets;
       generating first and second gate patterns having corresponding long axes extending substantially in the second direction;
       disposing the first gate pattern over the first set and at least a first part of the second set;
       disposing the second gate pattern over the third set and at least a second part of the second set;
       defining a first cell including the first gate pattern, the first set and the first part of the second set;
       defining a second cell including the second gate pattern, the third set and the second part of the second set;
       relative to the second direction, substantially abutting the first and second cells resulting in a first border region which is substantially aligned with an approximate midline of the second set; and
       relative to the second direction:
         disposing the second gate pattern to overlap the first border region; and
         disposing the first gate pattern to leave a first gap which is between the first gate pattern and the first border region.

10. The system of claim 9, wherein:
the generating the layout diagram further includes:
   generating a third set which represents a first part of a fourth set, each of the third and fourth sets including one or more fin patterns designated for the second conductivity type;
   further defining the second cell to include the third set;
   defining a third cell to include a second part of the fourth set; and
relative to the second direction, substantially abutting the third cell and the second cell resulting in:
   a second border region which is substantially aligned with an approximate midline of the fourth set; and
   a second gap which is between the second gate pattern and the second border region.

11. The system of claim 9, wherein:
the generating the layout diagram further includes:
   generating a third set which represents a first part of a fourth set;
   further defining the first cell to include the fourth set, each of the third and fourth sets including one or more fin patterns designated for the second conductivity type;
   defining a third cell to include a second part of the fourth set;
relative to the second direction, substantially abutting the third cell and the first cell resulting in:
   a second border region which is substantially aligned with an approximate midline of the fourth set; and
   sizing the first gate pattern to overlap the second border region.

12. The system of claim 9, further comprising at least one of:
   a masking facility configured to fabricate one or more semiconductor masks based on the layout diagram; or
   a fabricating facility configured to fabricate at least one component in a layer of a semiconductor integrated circuit based on the layout diagram.

13. A semiconductor device comprising:
first, second and third active regions, the first and third active regions having a first conductivity configuration, the second active region having a second conductivity configuration, and the first, second and third active regions having corresponding long axes extending substantially in a first direction;
relative to a second direction substantially perpendicular to the first direction, the second active region being between the first and third active regions;
first and second gate structures having corresponding long axes extending substantially in the second direction;
the first gate structure being over the first active region and at least a first part of the second active region;
the second gate structure being over the third active region and at least a second part of the second active region;
a first cell region including the first gate structure, the first active region and the first part of the second active region;
a second cell region including the second gate structure, the third active region and the second part of the second active region;
relative to the second direction, a first border region representing an overlap of the first and second cell regions which is substantially aligned with an approximate midline of the second active region; and
relative to the second direction:
the second gate structure overlapping the first border region; and
the first gate structure not extending to the first border region.

14. The semiconductor device of claim 13, wherein:
the second cell region further includes:
a fourth active region which represents a first part of a fifth active region, the fourth and fifth active regions having the second conductivity configuration; and
a third cell region including a second part of the fifth active region;
relative to the second direction:
an approximate midline of the fifth active region representing a second border region which is between the first and third cell regions; and
the second gate structure not extending to the second border region;
the first cell region further includes:
a sixth active region which represents a first part of a seventh active region, the sixth and seventh active regions having the second conductivity configuration;
a fourth cell region including a second part of the seventh active region; and
relative to the second direction:
an approximate midline of the seventh active region representing a third border region which is between the first and fourth cell regions; and
the first gate structure not extending to the second border region; and
the first gate structure overlaps the third border region.

15. The semiconductor device of claim 13, wherein:
the third active region represents a first part of a fourth active region, the fourth active region having the first conductivity configuration;
the semiconductor device further comprises:
a third cell region including a second part of the fourth active region; and
relative to the second direction:
an approximate midline of the fourth active region representing a second border region which is between the third and second cell regions; and
the second gate structure not extending to the second border region.

16. The semiconductor device of claim 13, wherein:
the third active region represents a first part of a fourth active region, the fourth active region having the first conductivity configuration;
the semiconductor device further comprises:
a third cell region including a second part of the fourth active region; and
relative to the second direction:
an approximate midline of the fourth active region representing a second border region which is between the first and third cell regions; and
the second gate structure overlaps the second border region.

17. The semiconductor device of claim 13, wherein:
the first active region represents a first part of a fourth active region, the fourth active region having the first conductivity configuration;
the semiconductor device further comprises:
a third cell region including a second part of the fourth active region; and
relative to the second direction:
an approximate midline of the fourth active region representing a second border region which is between the first and third cell regions; and
the first gate structure overlaps the second border region.

18. The semiconductor device of claim 13, wherein:
the first active region represents a first part of a fourth active region, the fourth active region having the first conductivity configuration;
the semiconductor device further comprises:
a third cell region including a second part of the fourth active region; and
relative to the second direction:
an approximate midline of the fourth active region representing a second border region which is between the first and third cell regions; and
the first gate structure not extending to the second border region.

19. The semiconductor device of claim 13, wherein:
the first, second and third active regions are configured with corresponding one or more fin structures having corresponding long axes extending substantially in the first direction.

20. The semiconductor device of claim 13, wherein:
the first and second conductivity configurations correspondingly are PMOS and NMOS; or
the first and second conductivity configurations correspondingly are NMOS and PMOS.

* * * * *